(12) United States Patent
Kariyazaki

(10) Patent No.: US 10,937,753 B1
(45) Date of Patent: Mar. 2, 2021

(54) SEMICONDUCTOR DEVICE

(71) Applicant: RENESAS ELECTRONICS CORPORATION, Tokyo (JP)

(72) Inventor: Shuuichi Kariyazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/793,546

(22) Filed: Feb. 18, 2020

(51) Int. Cl.
*H01L 23/00* (2006.01)
*H01L 23/528* (2006.01)
*H01L 23/498* (2006.01)
*G11C 5/06* (2006.01)

(52) U.S. Cl.
CPC ............. *H01L 24/45* (2013.01); *G11C 5/06* (2013.01); *H01L 23/49844* (2013.01); *H01L 23/5286* (2013.01)

(58) Field of Classification Search
CPC ............. H01L 24/45; H01L 23/49844; H01L 23/5286; G11C 5/06
See application file for complete search history.

(56) References Cited

U.S. PATENT DOCUMENTS 9,990,981 B2 6/2018 Suwa et al.
10,541,216 B2 1/2020 Nakagawa et al.
2017/0033038 A1* 2/2017 Nakagawa ........ H01L 23/49816
2017/0062322 A1* 3/2017 Sakata ..................... H01L 24/49
2018/0204827 A1* 7/2018 Betsui ..................... H01L 24/17
2019/0198463 A1 6/2019 Kariyazaki et al.

FOREIGN PATENT DOCUMENTS

JP 2017-033993 A 2/2017
JP 2019-114601 A 7/2019
JP 2019-114675 A 7/2019

* cited by examiner

*Primary Examiner* — Peniel M Gumedzoe
(74) *Attorney, Agent, or Firm* — McDermott Will & Emery LLP

(57) ABSTRACT

A semiconductor device comprising: a semiconductor chip; and a wiring substrate having: a first region overlapping with the semiconductor chip, and a second region surrounding the first region in plan view. Also, the wiring substrate includes: a first wiring layer, a third wiring layer, and a plurality of data wirings arranged so as to straddle a border between the first region and the second region. Also, the plurality of data wirings includes: a first data wiring transmitting a first byte data signal, and a second data wiring transmitting a second byte data signal. Also, in the first wiring layer, the first data wiring is arranged so as to straddle the border. Also, in the third wiring layer, the second data wiring is arranged so as to straddle the border. Further, in plan view, the first data wiring and the second data wiring are overlapped with each other.

14 Claims, 21 Drawing Sheets

SEMICONDUCTOR DEVICE

BACKGROUND

The present invention relates to a semiconductor device, and the present invention can be suitably applied to, for example, a semiconductor device including a wiring substrate on which a semiconductor chip having a data communication circuit is mounted.

There are disclosed techniques listed below.

[Patent Document 1] Japanese Unexamined Patent Application Publication No. 2017-33993.

[Patent Document 2] Japanese Unexamined Patent Application Publication No. 2019-114601.

[Patent Document 3] Japanese Unexamined Patent Application Publication No. 2019-114675.

Patent Document 1 discloses an electronic device that can conduct a data access between a semiconductor memory device mounted on a wiring substrate and a semiconductor device mounted on the wiring substrate. Patent Document 2 and Patent Document 3 disclose a semiconductor device including: a signal wiring that is transmitting an input signal to a semiconductor chip, and a signal wiring that is transmitting an output signal from the semiconductor chip and that is arranged in a wiring layer different from a wiring layer in which the signal wiring for the input signal is formed.

SUMMARY

In a signal transmission path for transmitting a data signal between a semiconductor chip having a data communication circuit and a memory component, characteristics such as a characteristic impedance and a maximum crosstalk amount need to be equal at a low level in each of a large number of signal transmission paths. In addition, it is necessary to reduce impedance in each of a plurality of paths for supplying power supply to the data communication circuit. In order to miniaturize a semiconductor device having the semiconductor chip having the data communication circuit, the signal transmission path and the power supply path are arranged at a higher density. Therefore, a technique for maintaining the characteristics of the signal transmission path and the power supply path is required.

Other objects and novel features will become apparent from the description of this specification and the accompanying drawings.

A semiconductor device according to one embodiment, comprises a semiconductor chip having a data communication circuit communicating a data signal; and a wiring substrate having: a first region overlapping with the semiconductor chip, and a second region surrounding the first region in plan view. Also, the semiconductor chip has a plurality of data electrodes each coupled with the data communication circuit and each transmitting the data signal. Also, the wiring substrate includes: a first wiring layer, a second wiring layer located in a lower layer than the first wiring layer, a third wiring layer located in a lower layer than the second wiring layer, a plurality of data terminals arranged at a position in the first region, which is facing the plurality of data electrodes of the semiconductor chip, and electrically connected with the plurality of data electrodes, respectively, and a plurality of data wirings arranged so as to straddle a border between the first region and the second region and electrically connected with the plurality of data terminals, respectively. Also, the plurality of data terminals includes: a plurality of first data terminals each transmitting a first byte data signal, and a plurality of second data terminals each transmitting a second byte data signal. Also, the plurality of data wirings includes: a plurality of first data wirings electrically connected with the plurality of first data terminals, respectively, and a plurality of second data wirings electrically connected with the plurality of second data terminals, respectively. Also, in plan view, a first data terminal group, in which the plurality of first data terminals is arranged next to each other, and a second data terminal group, in which the plurality of second data terminals is arranged next to each other, are arranged next to each other. Also, in the first wiring layer, each of the plurality of first data wirings is arranged so as to straddle the border between the first region and the second region. Also, in the third wiring layer, each of the plurality of second data wirings is arranged so as to straddle the border between the first region and the second region. Also, in plan view, the plurality of first data wirings and the plurality of second data wirings are overlapped with each other. Further, in the second wiring layer, a first ground pattern to which a ground potential is supplied is arranged at a position overlapping with each of the plurality of first data wirings and the plurality of second data wirings.

DETAILED DESCRIPTION

Figure 1:
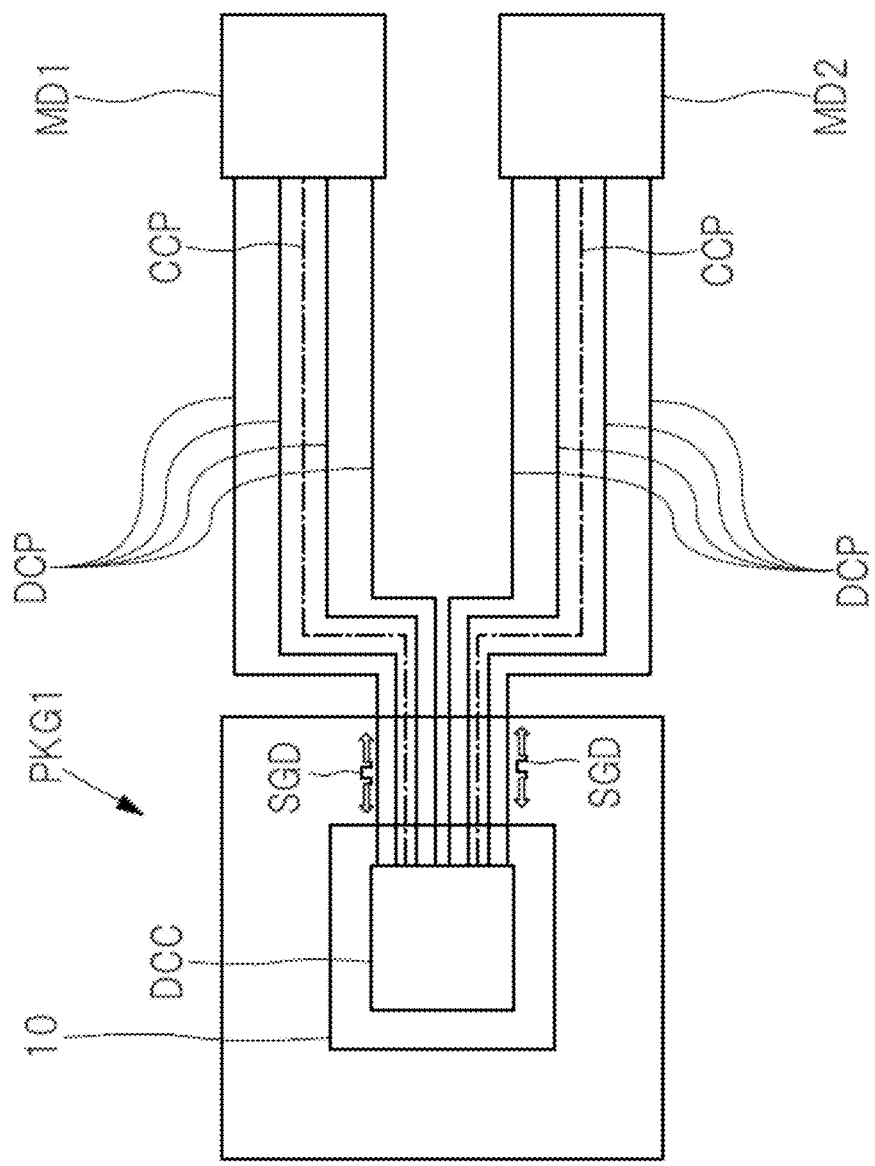
FIG. 1 is an explanatory diagram showing a configuration example of a data communication system including a semiconductor device according to an embodiment.

<Description of Forms, Basic Terms, and Laws>

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context. In the following description, a certain value and another value may be referred to as "the same" or "the same", but the meaning of "the same" or "the same" includes strictly the same cases as well as cases in which there is an error within a range that can be considered to be substantially equivalent.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void even if it is not a cross-section or to indicate the boundary of the area.

<Data Communication System>

First, an outline of a data communication system including semiconductor device of the present embodiment will be described. FIG. 1 is an explanatory diagram showing a configuration example of a data communication system including a semiconductor device according to an embodiment.

As shown in FIG. 1, a semiconductor device PKG1 of the present embodiment includes a data communication circuit DCC for transmitting a data signal SGD between a semiconductor chip 10 and memory devices MD1 and MD2. In an example shown in FIG. 1, the data communication circuit DCC transmits the data signal SGD to and from each memory device MD1 and MD2. A data communication circuit DCC of a modified example may be in data communication with one memory device MD1. The memory devices MD1 and MD2 are, for example, memory devices corresponding to the standard of LPDDR4 (Low Power Double Data Rate 4) operating with a bus-width of 32 bits and a transfer-rate of 3.2 GB/sec.

The semiconductor device PKG1 and the memory device MD1 are electrically connected to each other via a data-signal transmission path DCP for 32 bits. FIG. 1 shows a data signal transmission path DCP in byte units, and semiconductor device PKG1 and the memory devices MD1 are electrically connected via a data signal transmission path DCP for four bytes. Similarly, semiconductor device PKG1 and the memory device MD2 are electrically connected via a data-signal transmission path DCP for 4 bytes. Also, semiconductor device PKG1 and memory device MD1 are electrically connected via the control signal transmission pathway CCPs (indicated by dotted lines in FIG. 1) that transmit the control signal. Semiconductor device PKG1 and the memory device MD2 are electrically connected via a control signal transmission path CCP (indicated by a dashed line in FIG. 1) for transmitting a control signal SGC (refer to FIG. 5 to be described later).

The control signal SGC transmitted through the control signal transmission path CCP includes a clock signal, an address signal, and the like. Although these control signals SGC are transmitted by independent paths, two control signal transmission paths CCP are shown in FIG. 1. FIG. 1 shows examples in which the memory devices MD1 and MD2 are provided outside semiconductor device PKG1. As will be described later by way of modified example, the memory devices MD1 and MD2 may be incorporated in semiconductor device PKG1.

<Semiconductor Device>

Figure 2:
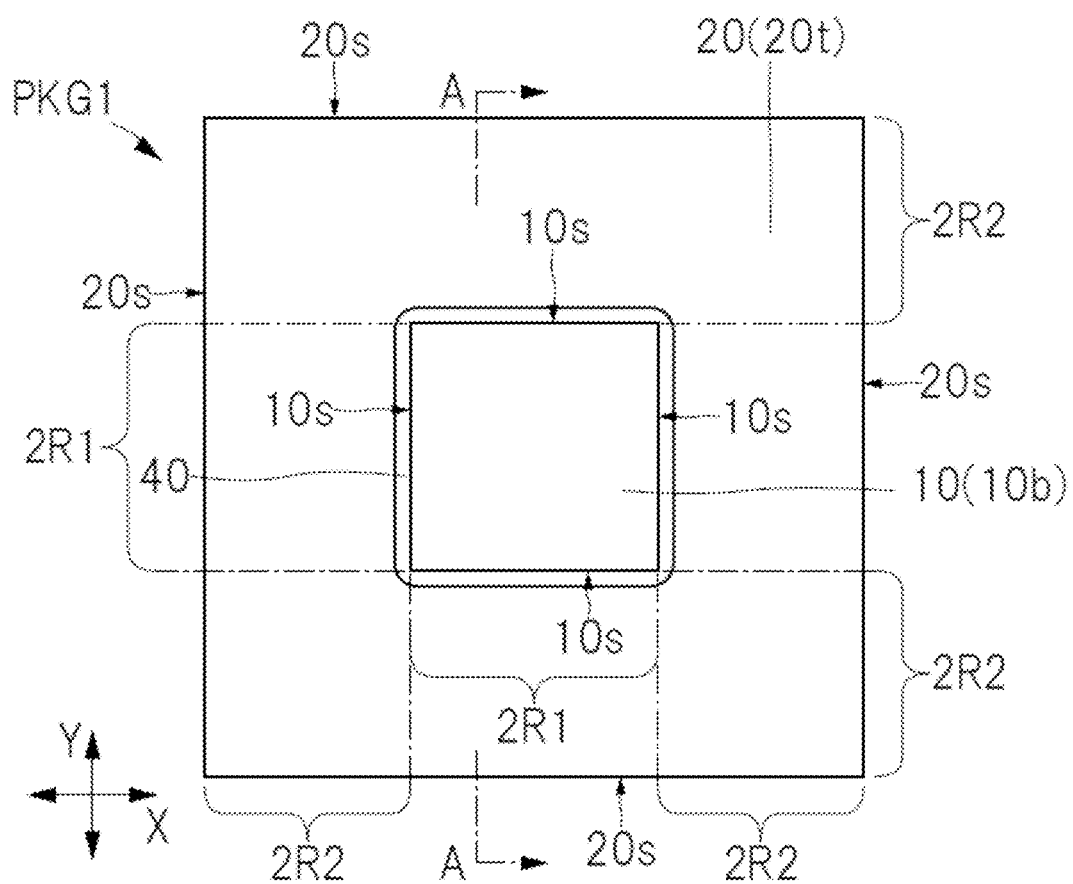
FIG. 2 is a plan view seen from a mounting surface side of the semiconductor device shown in FIG. 1, on which a semiconductor chip is mounted.
Figure 3:
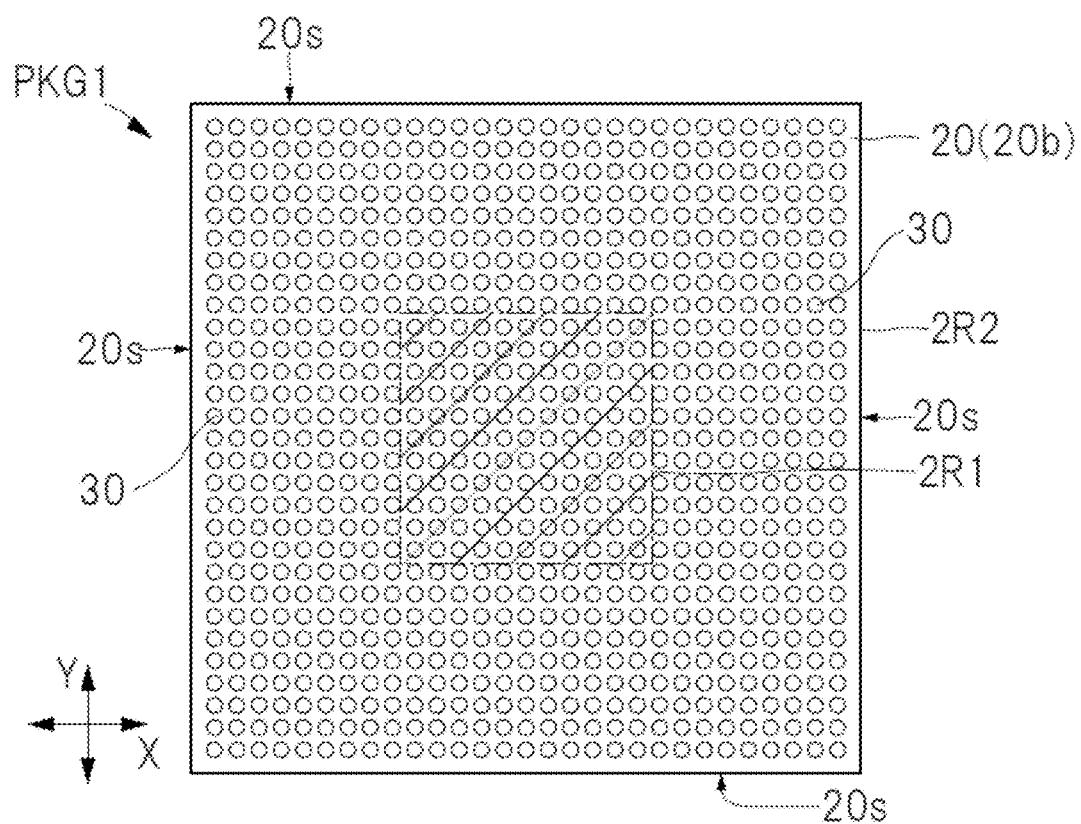
FIG. 3 is a bottom view of the semiconductor device shown in FIG. 2.
Figure 4:
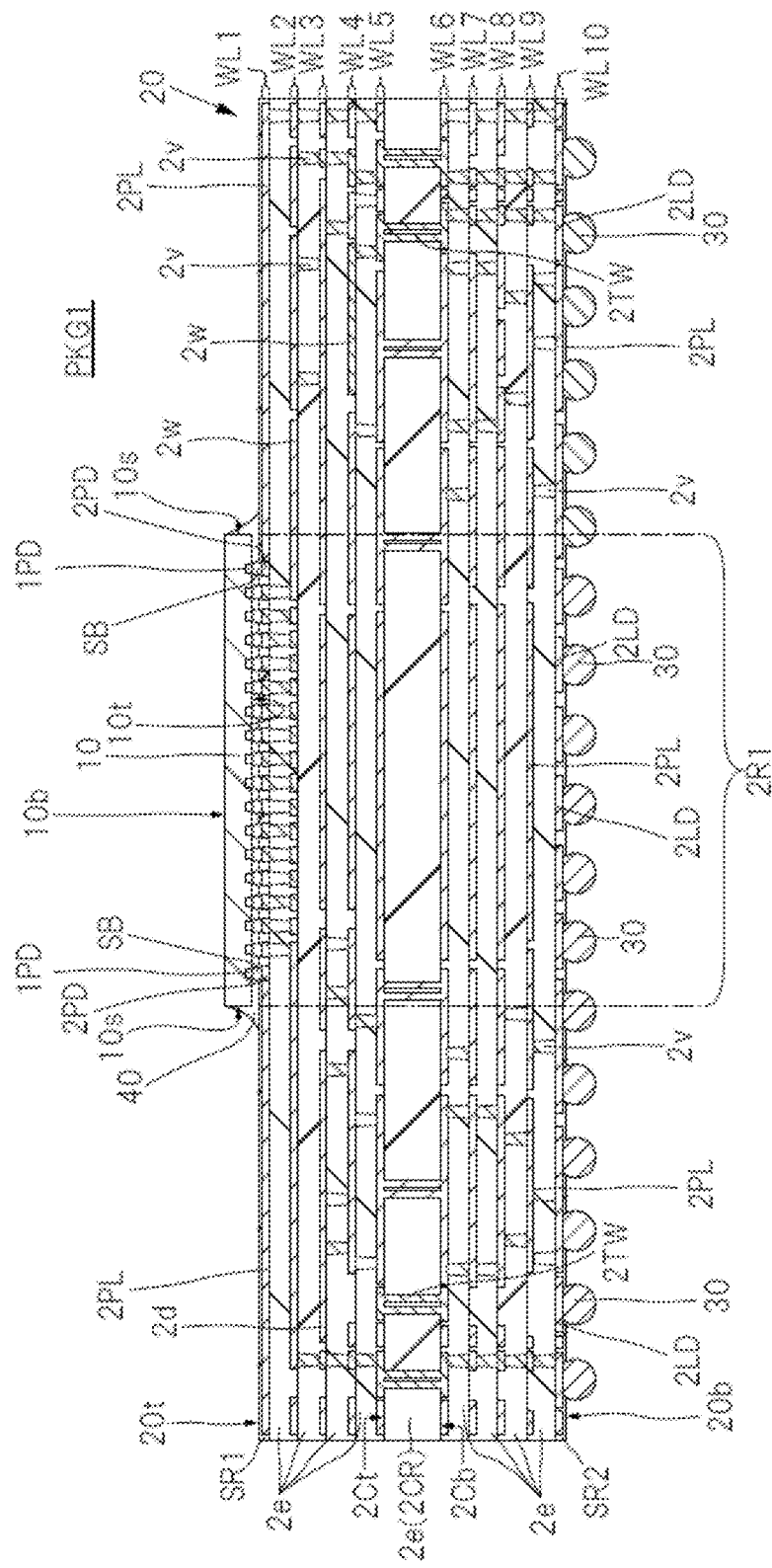
FIG. 4 is a cross-section view along line A-A of FIG. 2.

Next, an exemplary configuration of semiconductor device PKG1 shown in FIG. 1 will be described. FIG. 2 is a plan view seen from a mounting surface side of the semiconductor device shown in FIG. 1, on which a semiconductor chip is mounted. FIG. 3 is a bottom view of the semiconductor device shown in FIG. 2. Incidentally, FIG. 3 is a plan view, but the region 2R1 is hatched to clearly show the extent of the area 2R1. FIG. 4 is a cross-section view along line A-A of FIG. 2.

As shown in FIG. 2, a semiconductor device PKG1 of the present embodiment includes a semiconductor chip 10 and a wiring substrate 20 on which the semiconductor chip 10 is mounted. The semiconductor chip 10 is mounted on upper surface 20t of the wiring substrate 20. In a plan view of the semiconductor device PKG 1 seen from the mounting surface of the semiconductor chip 10 shown in FIG. 2, the wiring substrate 20 includes a region 2R1 overlapping with the semiconductor chip 10 and a region 2R2 surrounding the region 2R1 (for details, the periphery of the region 2R1). The regions 2R1 and 2R2 are provided on the lower surface 20b shown in FIG. 3 and a plurality of wiring layers shown in FIG. 4, in addition to upper surface 20t of the wiring substrate 20. In the thickness direction (Z direction shown in FIG. 4) of the wiring substrate 20, all portions overlapping with the semiconductor chip 10 corresponds to the region 2R1.

As shown in FIG. 4, the semiconductor chip 10 has a front surface (main surface, upper surface) 10t and a back surface (main surface, bottom surface) 10b which is opposed to the front surface 10t. Further, the semiconductor chip 10 has four sides 10s positioned at the outer edge in a plan view seen from one side to the other side of the front surface 10t and the back surface 10b. As shown in FIG. 2, the semiconductor chip 10 has a rectangular outer shape having a plane area smaller than that of the wiring substrate 20 in a plan view of the semiconductor chip 10. The semiconductor chip 10 is mounted on the center of upper surface 20t of the wiring substrate 20. Each of the four sides 10s of the semiconductor chip 10 extends along each of the four sides 20s of the wiring substrate 20.

A plurality of electrodes (chip electrodes, electrode pads, and electrode portions) 1PD is arranged on the front surface 10t of the semiconductor chip 10. In the present embodiment, a plurality of electrodes 1PD is arranged in a matrix on the front surface 10t of the semiconductor chip 10. By arranging a plurality of electrodes 1PD serving as external input/output terminals of the semiconductor chip 10 in a matrix form, even if the number of electrodes included in the semiconductor chip 10 increases, an increase in the planar area can be suppressed. Further, when the electrode 1PD for supplying an electric power is arranged in the central portion of the semiconductor chip 10 in plan view, the power supply path to the core circuit formed in the central portion of the semiconductor chip 10 can be shortened.

The front face 10t of the semiconductor chip 10 faces upper surface 20t of the wiring substrate 20. As described above, the method in which the semiconductor chip 10 is mounted on the wiring substrate 20 such that the surface 10t which is the electrode-forming surface of the semiconductor chip 10 faces upper surface 20t which is the chip mounting surface of the wiring substrate 20 is called a face-down mounting method or a flip-chip connecting method.

In the flip-chip connection method, the electrodes 1PD arranged on the front face 10t of the semiconductor chip 10 and the terminals 2PD arranged on upper surface 20t of the wiring substrate 20 are connected to each other via the protruding electrodes SB. As shown in FIG. 4, the protruding electrode SB is connected to each of the plurality of electrodes 1PD, and the plurality of electrodes 1PD of the semiconductor chip 10 and the plurality of terminals 2PD of the wiring substrate 20 are electrically connected with each other via a plurality of protruding electrodes SB, respectively.

The protruding electrode SB is a metal member formed so as to protrude on the surface 10t of the semiconductor chip 10. In the present embodiment, the protruding electrode SB is a so-called solder bump in which a solder material is laminated on the electrode 1PD with an under-bump metal interposed therebetween. The base metal film can be exemplified by, for example, a laminated film in which titanium (Ti), copper (Cu), and nickel (Ni) are laminated from the connecting surface with the electrodes 1PD (in some cases, a gold (Au) film is further formed on the nickel film). The solder material constituting the solder bumps is, for example, a Sn—Pb solder material containing lead (Pb) or a so-called lead-free solder substantially free of Pb. Examples of lead-free solders include, for example, tin (Sn), tin-bismuth (Sn—Bi), tin-copper-silver (Sn—Cu—Ag), tin-copper (Sn—Cu), and the like. Here, the lead-free solder means a solder in which the content of lead (Pb) is 0.1 wt % or less, and this content is determined as a standard of RoHS (Restriction of Hazardous Substances) instruction.

When the semiconductor chip 10 is mounted on the wiring substrate 20, solder bumps are formed on both the plurality of electrodes 1PD and the plurality of terminals 2PD in advance, and heat treatment (reflow process) is performed while the solder bumps are contacted with each other, whereby the solder bumps are integrated with each other to form the protruding electrodes SB. As a modified example against the present embodiment, pillar bumps in which a soldering film is formed on the end surfaces of conductive columns made of copper (Cu) or nickel (Ni) may be used as the protruding electrode SB.

Though not shown, there is also a case where the back surface 10b of the semiconductor chip faces the chip mounting surface of the wiring substrate 20 as a modified example to the present embodiment (referred to as a face-up mounting method). The electrodes 1PD of the chips 10 are arranged on the periphery of the front face 10t. The electrodes 1PD of the semiconductor chip and the terminals 2PD of the wiring substrate 20 are electrically connected to each other via wires (not shown). When semiconductor chips are mounted on the wiring substrate 20 in a face-down manner as in the present embodiment, the arrangement density of 1PD of electrodes per unit area can be improved. When the electrode 1PD of the semiconductor chip 10 and the terminal 2PD of the wiring substrate 20 are electrically connected to each other via the protruding electrode SB as in the present embodiment, the impedance of the transmission path between the electrode 1PD and the terminal 2PD can be reduced as compared with the impedance of the wire connection method.

A plurality of semiconductor elements (circuit elements) is formed on a main surface of the semiconductor chip 10 (more specifically, a semiconductor element forming area provided on an element forming surface of a semiconductor substrate which is a base material of the semiconductor chip 10). A plurality of semiconductor elements is electrically connected to each other to constitute a semiconductor circuit. The semiconductor chip 10 includes a plurality of semiconductor circuits, and the plurality of semiconductor circuits includes the data communication circuit DCC shown in FIG. 1. The plurality of electrodes 1PD is electrically connected with the plurality of semiconductor elements, respectively, via a wiring (not shown) formed in a wiring layer disposed inside the semiconductor chip 10 (in detail, between surface 10t and semiconductor element forming region (not shown)).

The semiconductor chip 10 (specifically, semiconductor substrate of the semiconductor chip 10) is made of, for example, silicon (Si). An insulating film covering semiconductor substrate of the semiconductor chip 10 and the wires of the semiconductor chip 10 is formed on the surface 10t, and the surface of each of the plurality of electrodes 1PD is exposed from the insulating film in the opening formed in the insulating film. Each of the plurality of electrodes 1PD is made of metallic, and in the present embodiment, aluminum (Al) or copper (Cu), for example, is made of aluminum (Al) or copper (Cu).

The wiring substrate 20 on which the semiconductor chip 10 is mounted has a upper surface 20t (refer to FIG. 2) on which the semiconductor chip 10 is mounted, and a lower surface (surface, main surface, and surface to be mounted) 20b (see FIG. 3) which is opposed to upper surface 20t. The wiring substrate has a rectangular outer shape in plan view. The wiring substrate 20 has four sides 20s constituting the outer edge of the wiring substrate 20 in a plan view seen from one side to the other side of upper surface 20t and the lower surface 20b.

As shown in FIG. 4, there are provided a plurality of conductor patterns and an insulating-layer 2e for insulating between the plurality of conductor patterns. The plurality of conductor patterns included in the wiring substrate 20 include a plurality of terminals 2PD, a wiring 2w, a via wiring 2v, a through-hole wiring 2TW, a land 2LD, and a conductor plane 2PL which is a large-area conductor pattern. The conductive plane 2PL includes a ground pattern and a power supply pattern, which will be described later.

The wiring substrate 20 has a plurality of wiring layers for electrically connecting the terminal 2PD of upper surface 20t as the chip-mounting surface and the land 2LD of the lower surface 20b as the chip-mounting surface. In the embodiment shown in FIG. 4, the wiring layer has ten wiring layers comprised of wiring layers WL1, WL2, WL3, WL4, WL5, WL6, WL7, WL8, WL9 and WL10 in order from the upper surface 20t. The wiring layer WL1 is a layer in which a plurality of terminals 2PD is formed, and may be replaced with a terminal forming layer. Similarly, the wiring layer WL10 is a layer in which a plurality of lands 2LD is formed, and may be replaced with a land forming layer. In other words, the wiring layer WL2, the wiring layer WL3 located in a lower layer than the wiring layer WL2, the wiring layer WL4 located in a lower layer than the wiring layer WL3, the wiring layer WL5 located in a lower layer than the wiring layer WL4, the wiring layer WL10 located in a lower layer than the wiring layer WL1, the wiring layer WL7 located in a lower layer than the wiring layer WL6, the wiring layer WL8 located in a lower layer than the wiring layer WL7, and the wiring layer WL9 located in a lower layer are provided between the wiring layer WL5 as a terminal forming layer and the wiring layer WL6 as a land forming layer. Each wiring layer WL2-WL9 is covered with an insulating layer 2e. A plurality of openings is provided in the insulating layer 2e covering each wiring layer, and via wirings (vias and interlayer conductive paths) 2v are buried in each of the plurality of openings. Each of the wiring layers WL1, WL2, WL3, WL4 and WL5 is electrically connected via a plurality of via wirings 2v. Similarly, the wiring layers WL6, WL7, WL8, WL9 and WL10 are electrically connected to each other via a plurality of via wirings 2v.

The plurality of wiring layers of the wiring substrate 20 is formed, for example, by laminating a plurality of wiring layers on upper surface 2Ct and the lower surface 2Cb of an insulating layer (core layer, core material, core insulating layer) 2CR made of a prepreg material in which a glass fiber is impregnated with a resin by a build-up method. The wiring layer WL5 on upper surface 2Ct of the insulating layer 2CR and the wiring layer WL6 on the lower surface 2Cb are electrically connected via a plurality of through-hole wirings (interlayer conductive paths) 2TW embedded in a plurality of through-holes (through-holes) provided so as to pass through one of upper surface 2Ct and the lower surface 2Cb to the other.

A plurality of terminals (terminal portions, pads, and semiconductor chip connecting terminals) 2PD electrically connected to the semiconductor chip 10 are formed on upper surface 20t of the wiring substrate 20. Each of the plurality of terminals 2PD is an internal-interface terminal for electrically connecting the semiconductor chip 10 and the wiring substrate 20 to each other. A plurality of lands (terminals, external terminals, electrodes, and external electrodes) 2LD, which is external input/output terminals of semiconductor device PKG1, are formed on the lower surface 20b of the wiring substrate 20. The land 2LD is an external interface terminal for electrically connecting the wiring substrate 20 and an external device (for example, a mounting substrate 50 shown in FIG. 20 described later).

The plurality of terminals 2PD and the plurality of lands 2LD are electrically connected via a plurality of wirings 2w formed in the wiring substrate 20 and a plurality of via wirings 2v and a through-hole wiring 2TW electrically connecting the wiring layer WL3 and the wiring layer WL4, which are interlayer conductive paths. In the embodiment shown in FIG. 4, an insulating layer 2CR serving as a core layer is provided between the wiring layer WL5 and the wiring layer WL6 of the wiring substrate 20. The core layer is harder and thicker than the other insulating layer 2e. Therefore, the insulating layer 2CR is provided with a plurality of through holes formed so as to penetrate from one to the other of upper surface 2Ct and the lower surface 2Cb of the insulating layer 2CR. Each of the plurality of through holes is filled with a conductor (e.g., a metallic such as copper) to form a through-hole wiring 2TW functioning as an interlayer conductive path. The detailed configuration of the wiring layers included in the wiring substrate 20 will be described later.

In the embodiment shown in FIG. 4, external terminals (solder balls, solder materials, terminals, external terminals, electrodes, and external electrodes) 30 are connected to each of the plurality of lands 2LD. The external terminal 30 is a conductive member that electrically connects a plurality of terminals (not shown) on the mounting substrate side and a plurality of lands 2LD when semiconductor device PKG1 is mounted on a mounting substrate (not shown). The external terminal 30 is made of, for example, lead-free solder, similarly to the above-described protruding electrode SB.

As shown in FIG. 3, the plurality of external terminals 30 is arranged in a matrix. Although not shown in FIG. 3, a plurality of lands 2LD (see FIG. 4) to which a plurality of external terminals 30 is bonded is also arranged in a matrix form. In this manner, a semiconductor device in which a plurality of external terminals (external terminals 30 and lands 2LD) is arranged in a matrix on the surface on which the wiring substrate 20 is mounted is referred to as an area array type semiconductor device. The area array-type semiconductor device is preferable in that an increase in the mounting area of semiconductor device can be suppressed even if the number of external terminals increases because the mounting surface (lower surface 20b) of the wiring substrate 20 can be effectively used as a space for arranging the external terminals. In other words, a semiconductor device in which the number of external terminals increases as the function and integration become higher can be mounted in a space-saving manner.

In the example shown in FIG. 3 and FIG. 4, a so-called BGA (Ball Grid Array) type semiconductor package in which a solder ball which is a ball-shaped solder material is used as the external terminal 30 is exemplarily shown, but there are various modified example in the arrangement and the construction of the external terminals. For example, there is a modified example of a structure in which a plurality of lands 2LD are exposed on the lower surface 20b shown in FIG. 4, a structure in which a thin soldering material is bonded to a plurality of lands 2LD exposed on the lower surface 20b, or the like. These modified example packages are referred to as Land Grid Array type.

As shown in FIG. 4, an underfill resin 40 is disposed between the semiconductor chip 10 and the wiring substrate 20. The underfill resin 40 is disposed so as to close a gap between the front surface 10t of the semiconductor chip 10 and upper surface 20t of the wiring substrate 20. The underfill resin 40 is made of an insulating (non-conductive) material (e.g., a resin material), and is disposed so as to seal the electrically connecting portions (junction portions of the plurality of protruding electrodes SB) of the semiconductor chip 10 and the wiring substrate 20. As described above, by arranging the underfill resins 40 so as to seal the connection portions of the plurality of protruding electrodes SB, stresses generated in the electrical connection portions of the semiconductor chip 10 and the wiring substrate 20 can be achieved.

<Configuration Example of Data Communication Circuit>

Figure 5:
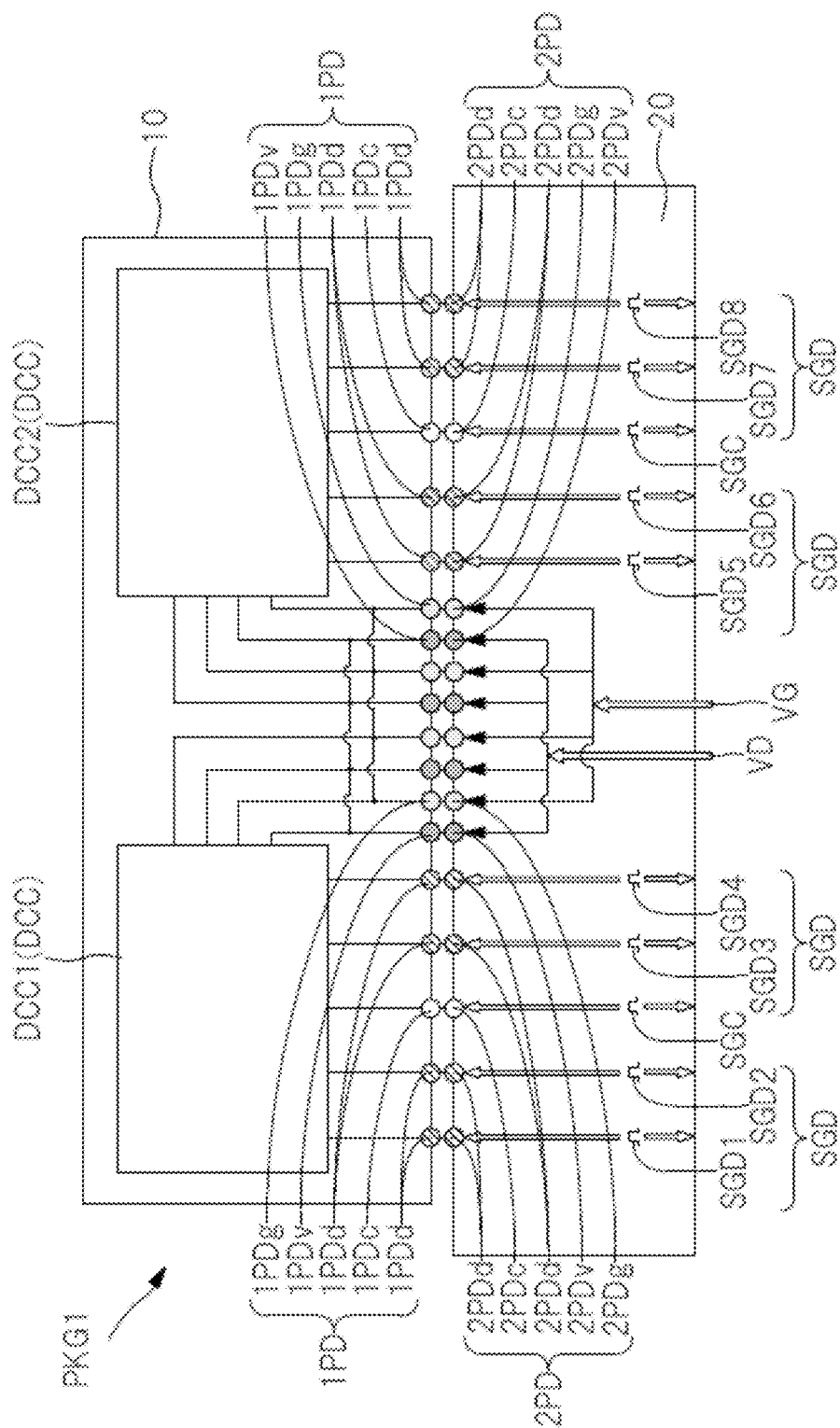
FIG. 5 is an explanatory diagram schematically showing a configuration example of a data communication circuit of the semiconductor chip shown in FIG. 4.

Next, a configuration example of the data communication circuit DCC included in the semiconductor chip 10 shown in FIG. 1 will be described. FIG. 5 is an explanatory diagram schematically showing a configuration example of a data communication circuit of the semiconductor chip shown in FIG. 4. In FIG. 5, in order to distinguish each of the plurality of electrodes 1PD and the plurality of terminals 2PD, dotted patterns and hatching are shown.

As shown in FIG. 5, the data communication circuit DCC included in the semiconductor chip 10 includes a data communication circuit DCC1 for communicating with the memory device MD1 (refer to FIG. 1) and a data communication circuit DCC2 for communicating with the memory device MD2 (see FIG. 1). Each of the data communication circuits DCC1 and DCC2 includes, for example, an input/output circuit for controlling the input or output of the data signal SGD and the control signal SGC between the semiconductor chip 10 and the outside of the semiconductor chip 10.

The semiconductor chip 10 is connected to the data communication circuit DCC, and the semiconductor chip 10 has a plurality of data electrodes 1PDd for transmitting data signals. FIG. 5 schematically shows that each of the data communication circuits DCC1 and DCC2 is coupled with four data electrodes 1PDd. However, each of the data communication circuits DCC1 and DCC2 is electrically connected with the data electrode 1PDd of 32 bits, for example. In an example shown in FIG. 5, the data communication circuit DCC1 transmits the first byte data signal SGD1 from the 0th bit to the 7th bit, the second byte data signal SGD2 from the 8th bit to the 15th bit, the third byte data signal SGD3 from the 16th bit to the 23rd bit, and the fourth byte data signal SGD4 from the 24th bit to the 31st bit. The data communication circuit DCC2 transmits the fifth byte data signal SGD5 from the 0th bit to the 7th bit, the sixth byte data signal SGD6 from the 8th bit to the 15th bit, the seventh byte data signal SGD7 from the 16th bit to the 23rd bit, and the eighth byte data signal SGD8 from the 24th bit to the 31st bit.

The semiconductor chip 10 is connected to the data communication circuit DCC, and the semiconductor chip 10 has a plurality of control electrodes 1PDc for transmitting control signals SGC. The semiconductor chip 10 includes a plurality of power supply electrodes 1PDv for supplying the power supply potential VD to the data communication circuit DCC, and a plurality of ground electrodes 1PDg for supplying the ground potential VG to the data communication circuit DCC. In the embodiment shown in FIG. 5, the plurality of power supply electrodes 1PDv is electrically connected to each other. The plurality of ground electrodes 1PDg is electrically connected to each other.

The wiring substrate 20 has a plurality of data terminals 2PDd electrically connected to the plurality of data electrodes 1PDd. As shown in FIG. 4, each of the plurality of terminals 2PD of the wiring substrate 20 is disposed to face the plurality of electrodes 1PD of the semiconductor chip 10 in the region 2R1 of the wiring substrate 20. Therefore, the plurality of data terminals 2PDd shown in FIG. 5 is arranged at a position in the region 2R1 of the wiring layer WL1, which is facing the plurality of data electrodes 1PDd, as shown in FIG. 4. The wiring substrate has a plurality of control terminals 2PDc electrically connected with the plurality of control electrodes 1PDc. The plurality of control terminals 2PDc is arranged at a position in the region 2R1 of the wiring layer WL1, which is facing the plurality of control electrodes 1PDc, as shown in FIG. 4. The wiring substrate 20 has a plurality of power supply terminals 2PDv electrically connected with the plurality of power supply electrodes 1PDv. The plurality of power supply terminals 2PDv is arranged at a position in the region 2R1 of the wiring layer WL1, which is facing the plurality of power supply electrodes 1PDv, as shown in FIG. 4. The wiring substrate 20 has a plurality of ground terminals 2PDg electrically connected with the plurality of ground electrodes 1PDg. The plurality of ground terminals 2PDg is arranged at a position in the region 2R1 of the wiring layer WL1, which is facing the plurality of ground electrodes 1PDg, as shown in FIG. 4.

<Details of Wiring Layout>

Figure 6:
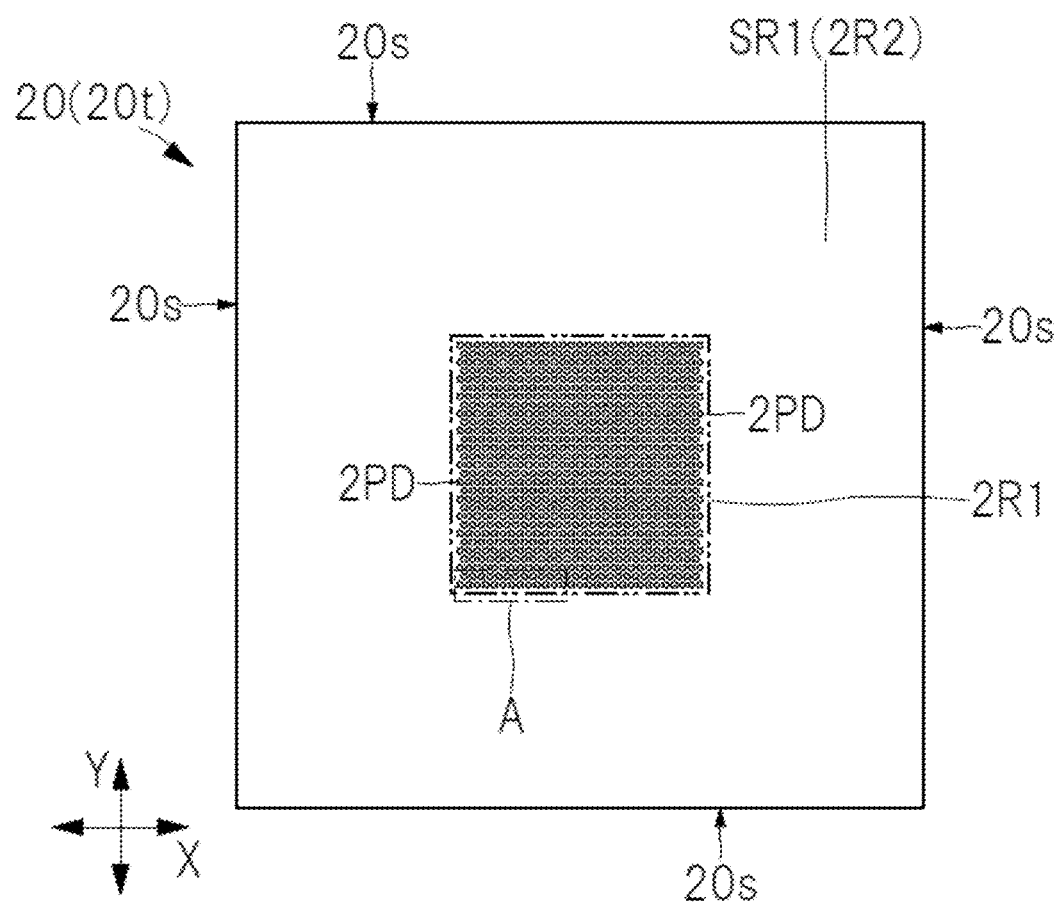
FIG. 6 is a plan view showing an upper surface of the wiring substrate shown in FIG. 2, from which the semiconducting chip and an underfill resin are removed.
Figure 7:
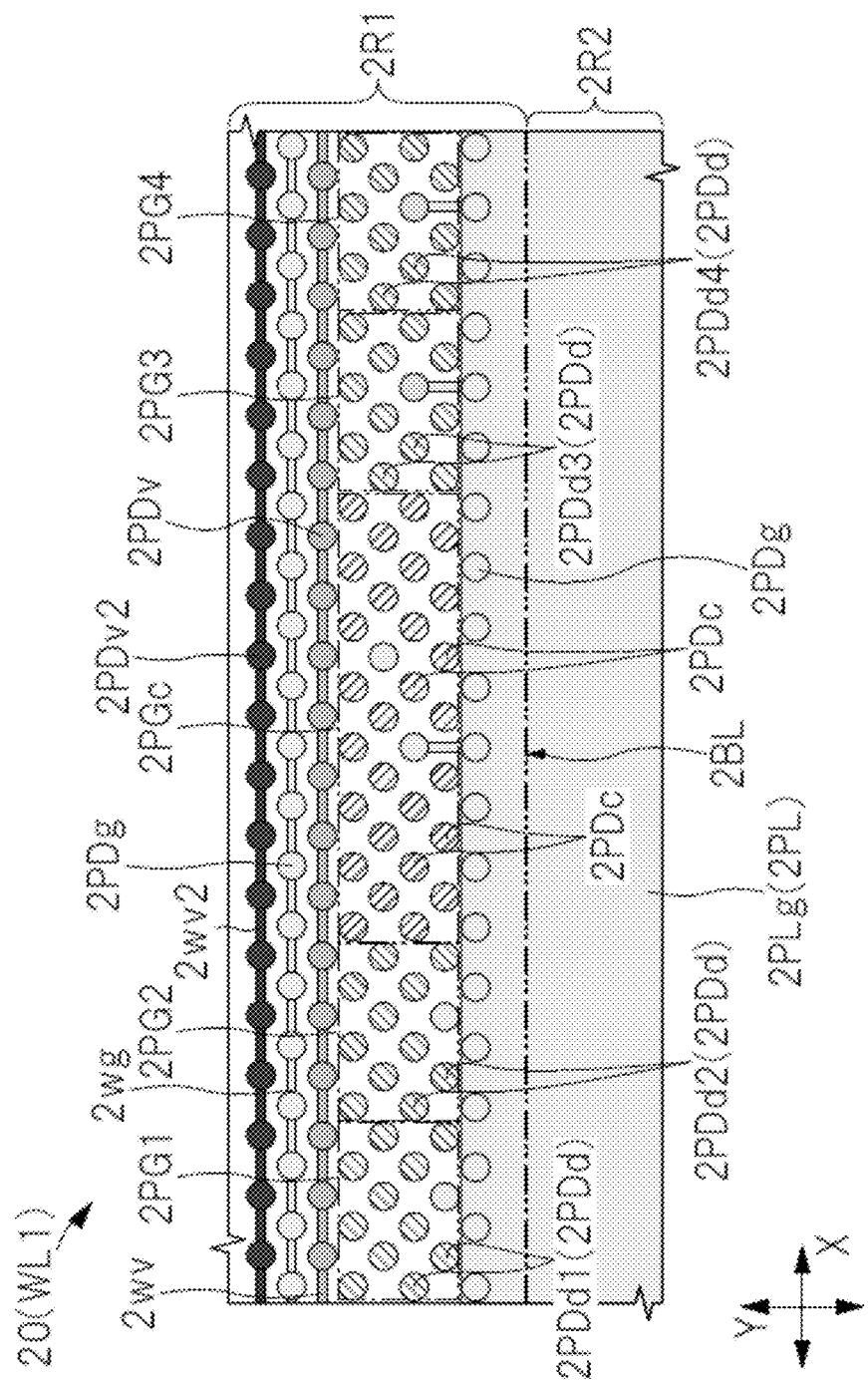
FIG. 7 is an enlarged plan view at a portion A of FIG. 6, from which the insulating film of the uppermost layer shown in FIG. 6 is removed.

Next, wiring layouts in the wiring layers of the wiring substrate 20 shown in FIG. 4 will be described in detail with reference to the drawings. FIG. 6 is a plan view showing an upper surface of the wiring substrate shown in FIG. 2, from which the semiconducting chip and an underfill resin are removed. FIG. 7 is an enlarged plan view at a portion A of FIG. 6, from which the insulating film of the uppermost layer shown in FIG. 6 is removed. Incidentally, FIG. 7 is a plan view, but different patterns are given according to the types of signals or potentials flowing to the terminal 2PD. Also, in FIGS. 8 to 16 described below, patterns different from each other are assigned in accordance with the same rules as in FIG. 7, depending on the type of signal or potential flowing through the conductor pattern or wiring.

As shown in FIG. 4, an insulating film SR1 is formed on the uppermost wiring layer WL1 of the wiring substrate 20. The insulating film SR1 is an organic insulating film (solder resist film) for protecting upper surface 20t of the wiring substrate 20. In the wiring layer WL1, a portion corresponding to the plurality of terminals 2PD in the region 2R1 overlapping with the semiconductor chip 10 is exposed from the insulating film SR1. The entire area 2R2 is covered with the insulating film SR1. In the wiring layers WL1, a plurality of terminals 2PD are formed in regions 2R1 exposed from the insulating film SR1. The plurality of terminals 2PD shown in FIG. 6 include a plurality of data terminals 2PDd, a plurality of control terminals 2PDc, a plurality of power supply terminals 2PDv, and a plurality of ground terminals 2PDg shown in FIG. 7. In the embodiment shown in FIG. 7, the plurality of terminals 2PD include a plurality of core power supply terminals 2PDv2. The plurality of core power supply terminals 2PDv2 are terminals for supplying a power supply potential (a potential differing from the power supply potential VD shown in FIG. 5) to a core circuit (for example, an arithmetic processing circuit or the like) (not shown). A ground pattern (ground plane) 2PLg to which a ground potential VG (refer to FIG. 5) is supplied is formed in the wiring layer WL1. In the wiring layers WL1, the ground patterns 2PLg are formed so as to cover most of the regions 2R2. As shown in FIG. 7, the ground patterns 2PLg of the wiring layers WL1 are formed so as to straddle the borderline 2BL between the regions 2R1 and 2R2. A part of the ground pattern 2PLg is formed in the region 2R1, and is integrated with a part of the plurality of ground terminals 2PDg.

As shown in FIG. 7, the plurality of terminals 2PD are regularly arranged in the region 2R1. A plurality of ground terminals 2PDg integrally formed with the ground patterns 2PLg are formed in the first column closest to the border line 2BL between the region 2R1 and the region 2R2. In the second to fifth columns, a plurality of data terminals 2PDd and a plurality of control terminals 2PDc are arranged. In the sixth column, a plurality of power supply terminals 2PDv are arranged and electrically connected to each other via wires $2wv$. In the seventh column, a plurality of ground terminals 2PDg are arranged and electrically connected to each other via wires $2wg$. In the eighth column, a plurality of core power supply terminals 2PDv2 are arranged and electrically connected to each other via wires $2wv2$. In the region 2R1, each of the plurality of data terminals 2PDd is arranged on the outer peripheral side of the plurality of power supply terminals 2PDv, in other words, on the side closer to the area 2R2. Similarly, in the region 2R1, each of the plurality of control terminals 2PDc is disposed on the outer peripheral side of the plurality of power supply terminals 2PDv, in other words, on the side closer to the region 2R2.

The plurality of data terminals 2PDd are arranged collectively in units of bytes of data signals to be transmitted. In the example shown in FIG. 7, the second to fifth columns of the terminal array include a data terminal group (first terminal group) 2PG1 arranged such that a plurality of data terminals 2PDd1 to which the first byte data signal SGD1 is transmitted is arranged next to each other, a data terminal group (second terminal group) 2PG2 arranged such that a plurality of data terminals 2PDd2 to which the second byte data signal SGD2 is transmitted is arranged next to each other, a data terminal group (third terminal group) 2PG3 arranged such that a plurality of data terminals 2PDd3 to which the third byte data signal SGD3 is transmitted is arranged next to each other, and a data terminal group (fourth terminal group) 2PG4 arranged such that a plurality of data terminals 2PDd4 to which the fourth byte data signal SGD4 is transmitted is arranged next to each other. The data terminal group 2PG1 and the data terminal group 2PG2 are adjacent to each other. The terminal group, 2PG3, and the data terminal group 2PG4 are adjacent to each other. Each data terminal group 2PG1-2PG4 includes eight DQ terminals for transmitting a DQ signal, one DM terminal for transmitting a DM signal, two DQS terminals for transmitting a DQS signal, and a reference terminal used for reference and electrically connected to the ground terminal 2PDg.

The plurality of control terminals 2PDc are arranged collectively. The second to fifth columns of the terminal array include a control terminal group 2PGc in which a plurality of control terminals 2PDc are arranged. The data terminal groups 2PG1, 2PG2, 2PG3 and PG4 and the control terminal group 2PGc are arranged along a side (a side overlapping with one of the four sides of the semiconductor chip 10 shown in FIG. 2) of the region 2R1. The control terminal group 2PGc is arranged adjacent to the data terminal group 2PG2 and the data terminal group 2PG3. In other words, the control terminal group 2PGc is disposed between the data terminal group 2PG2 and the data terminal group 2PG3. The plurality of terminals 2PDc include a clock terminal to which a clock signal is transmitted, an address terminal to which an address signal is transmitted, and the like. The number of control terminals 2PDc is larger than the number of data terminals 2PDd included in each data terminal group 2PG1-2PG4.

The enlarged view shown in FIG. 7 is an enlarged plan view of the part A in FIG. 6, and corresponds to the terminal layouts of the terminals 2PD connected to the data communication circuits DCC1 in FIG. 5. Though not shown in the enlarged view, the same number of data terminals 2PDd and the same number of control terminals 2PDc as those in FIG. 7 are arranged in the region adjacent to the portion A shown in FIG. 6, and are connected to the data communication circuits DCC2 shown in FIG. 5.

Figure 8:
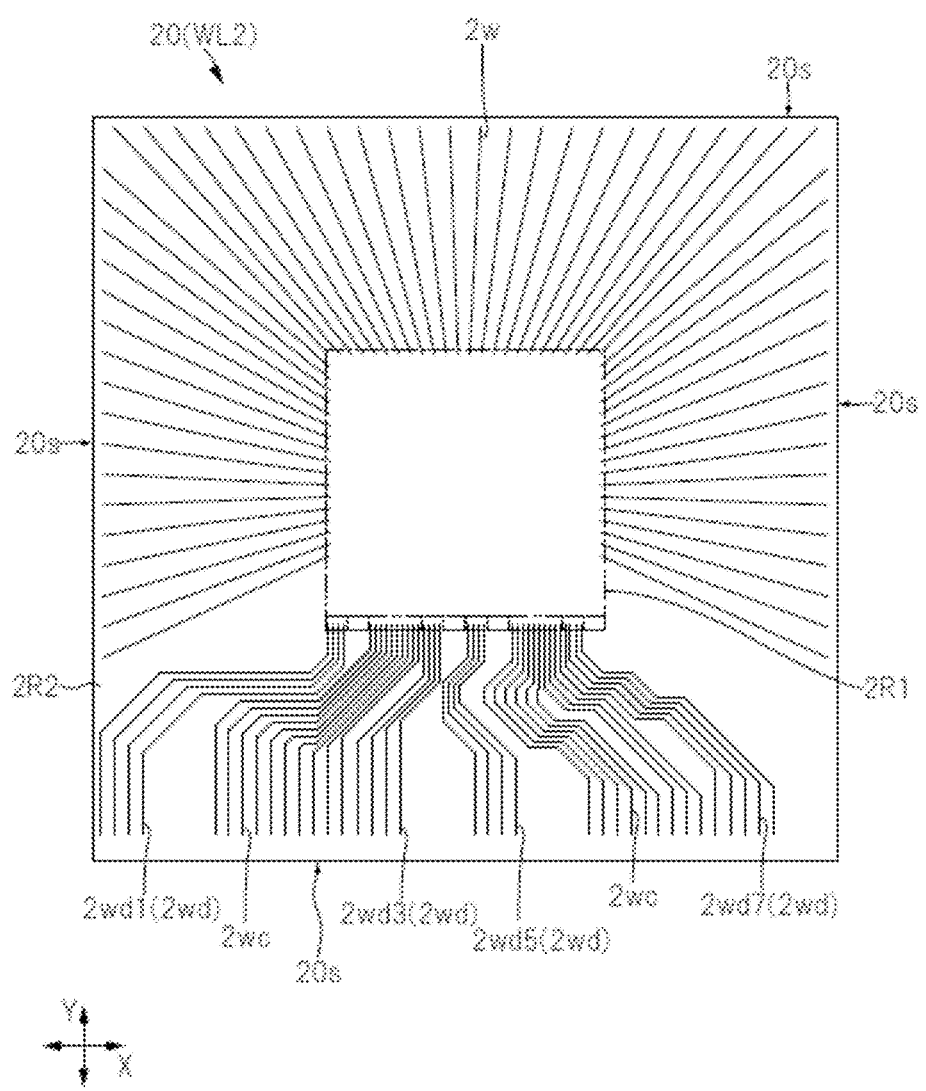
FIG. 8 is a plan view showing an example of layouts of the second wiring layer in the wiring substrate shown in FIG. 4.
Figure 9:
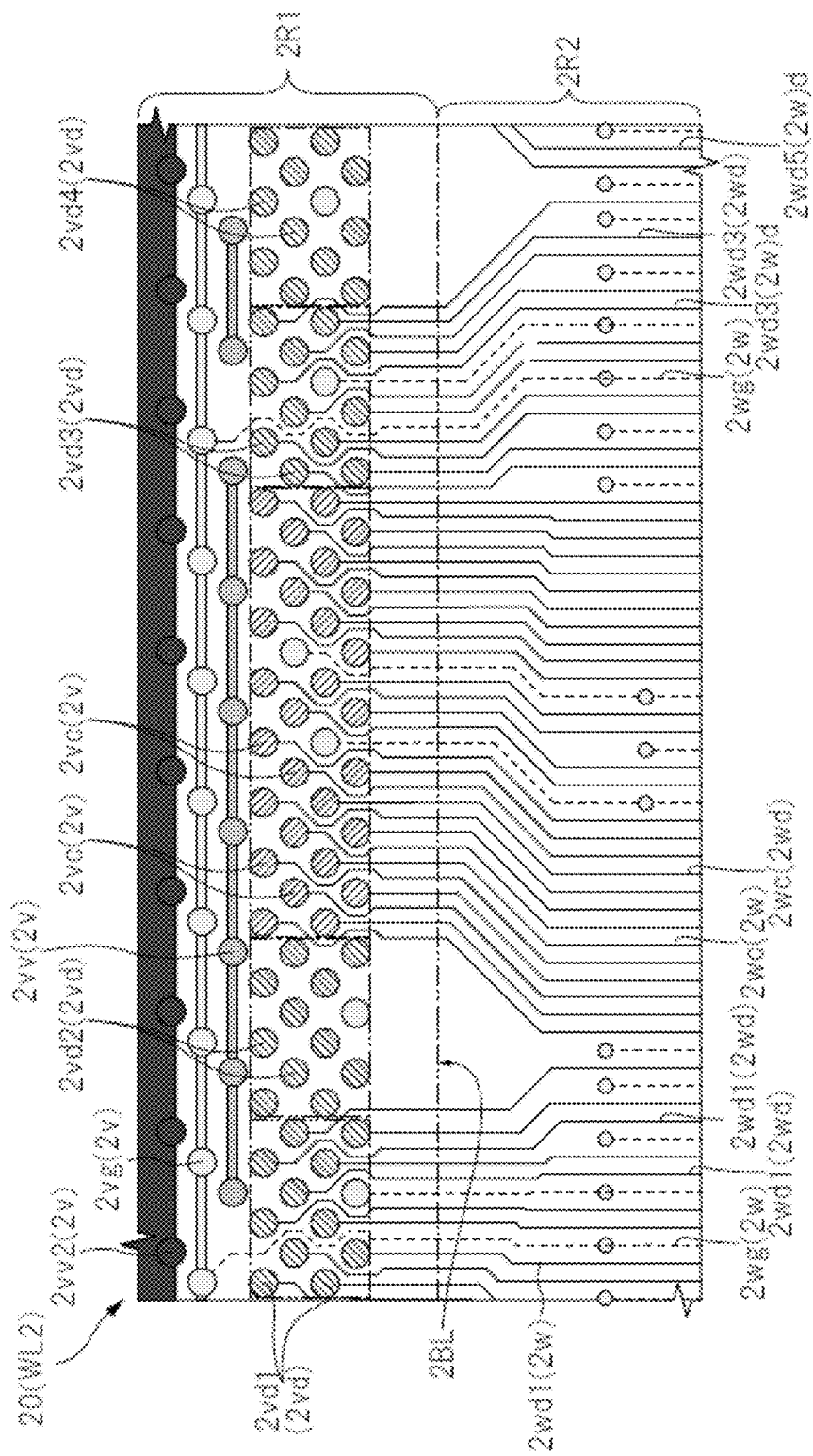
FIG. 9 is an enlarged plan view including a portion corresponding to the portion A of FIG. 6, in the wiring layer shown in FIG. 8.
Figure 10:
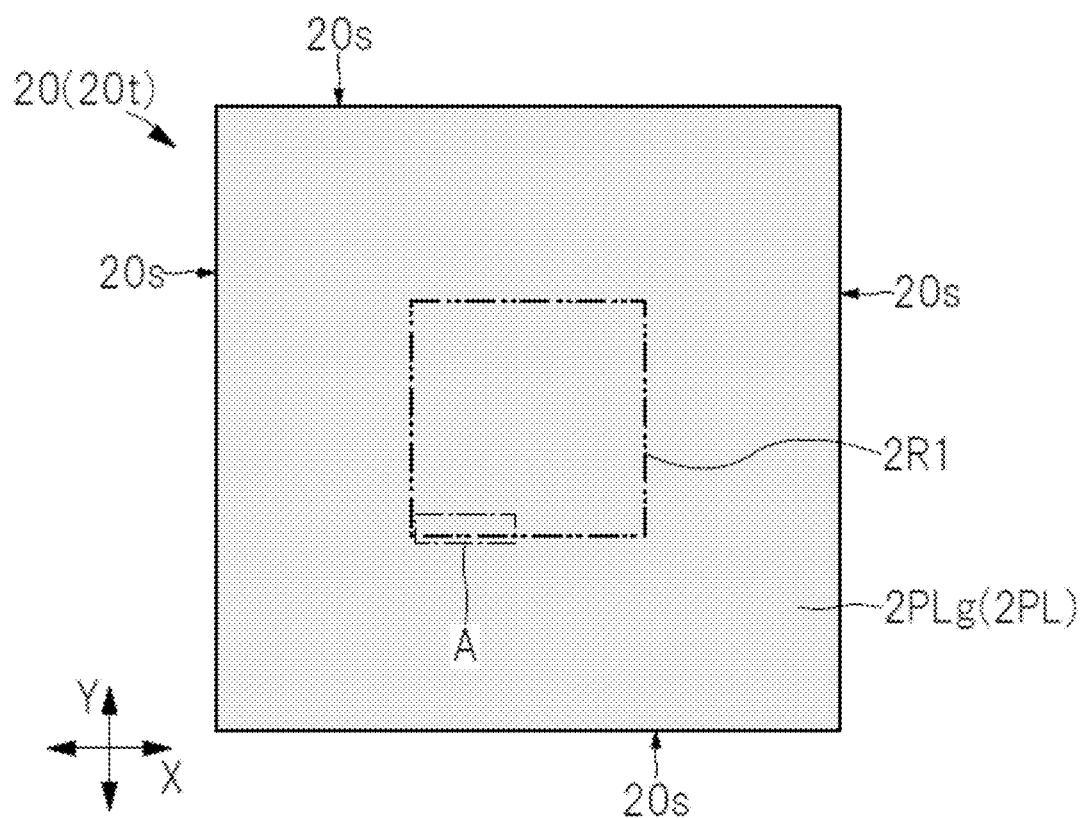
FIG. 10 is a plan view showing an example of layouts of the third wiring layer in the wiring substrate shown in FIG. 4.
Figure 11:
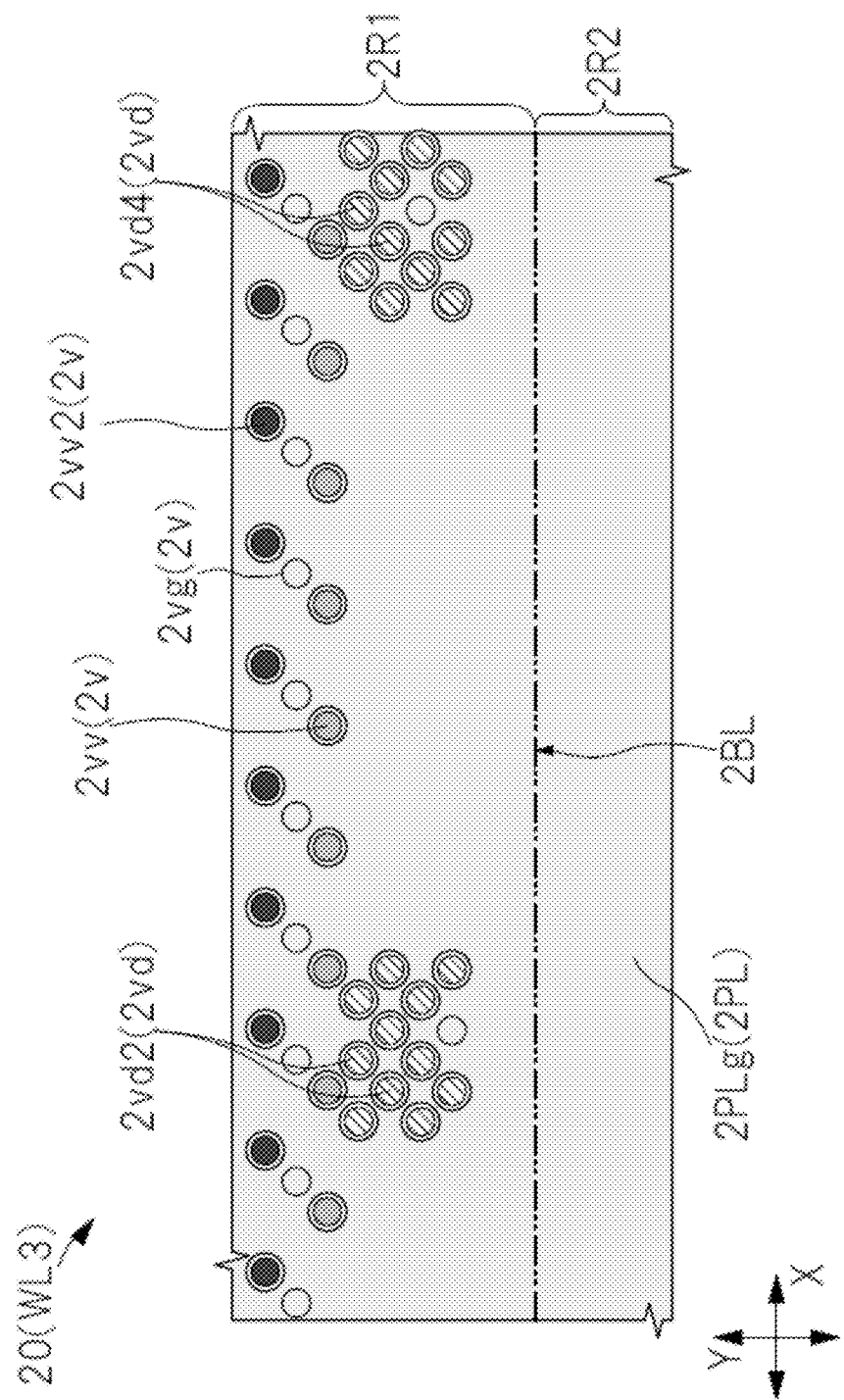
FIG. 11 is an enlarged plan view at a portion A of FIG. 10.
Figure 12:
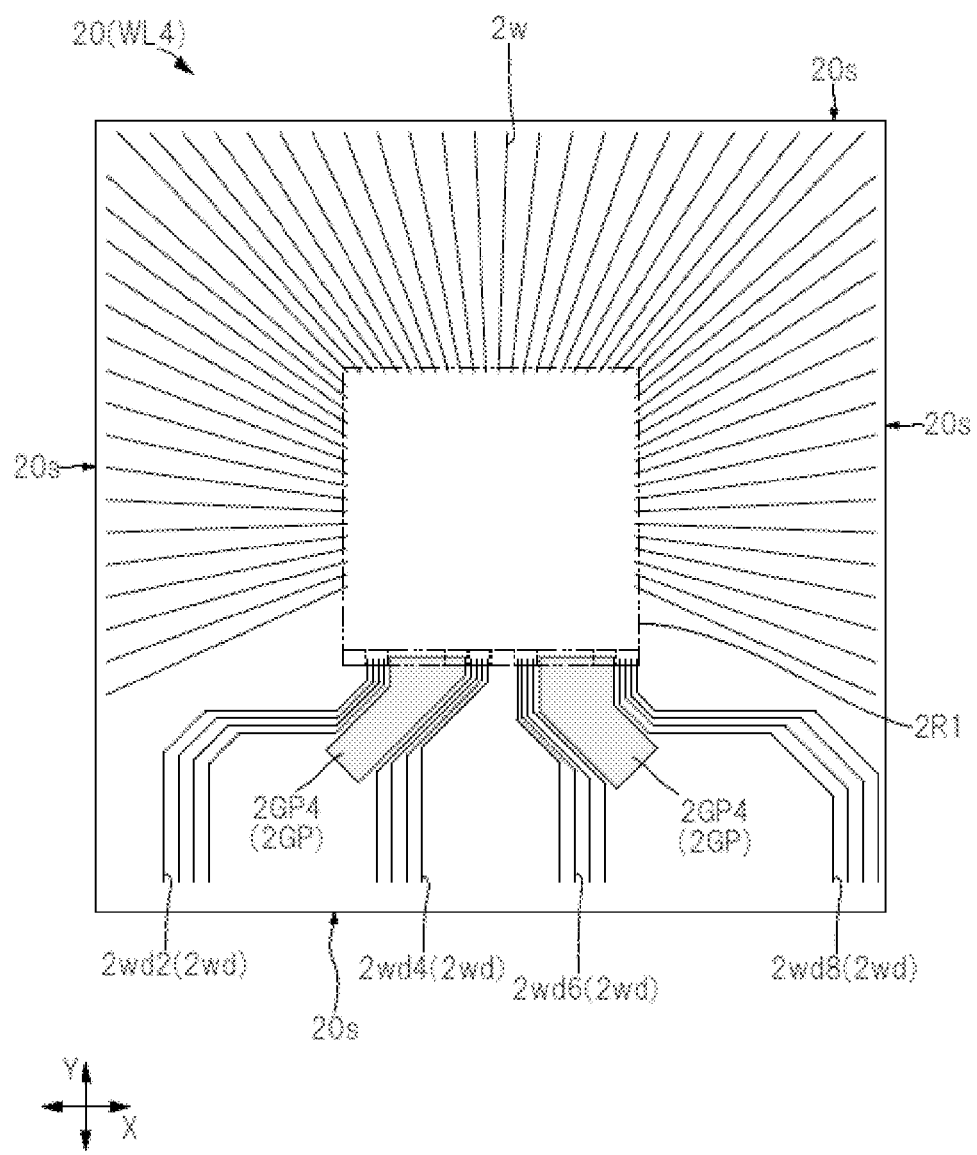
FIG. 12 is a plan view showing an example of layouts of the fourth wiring layer in the wiring substrate shown in FIG. 4.
Figure 13:
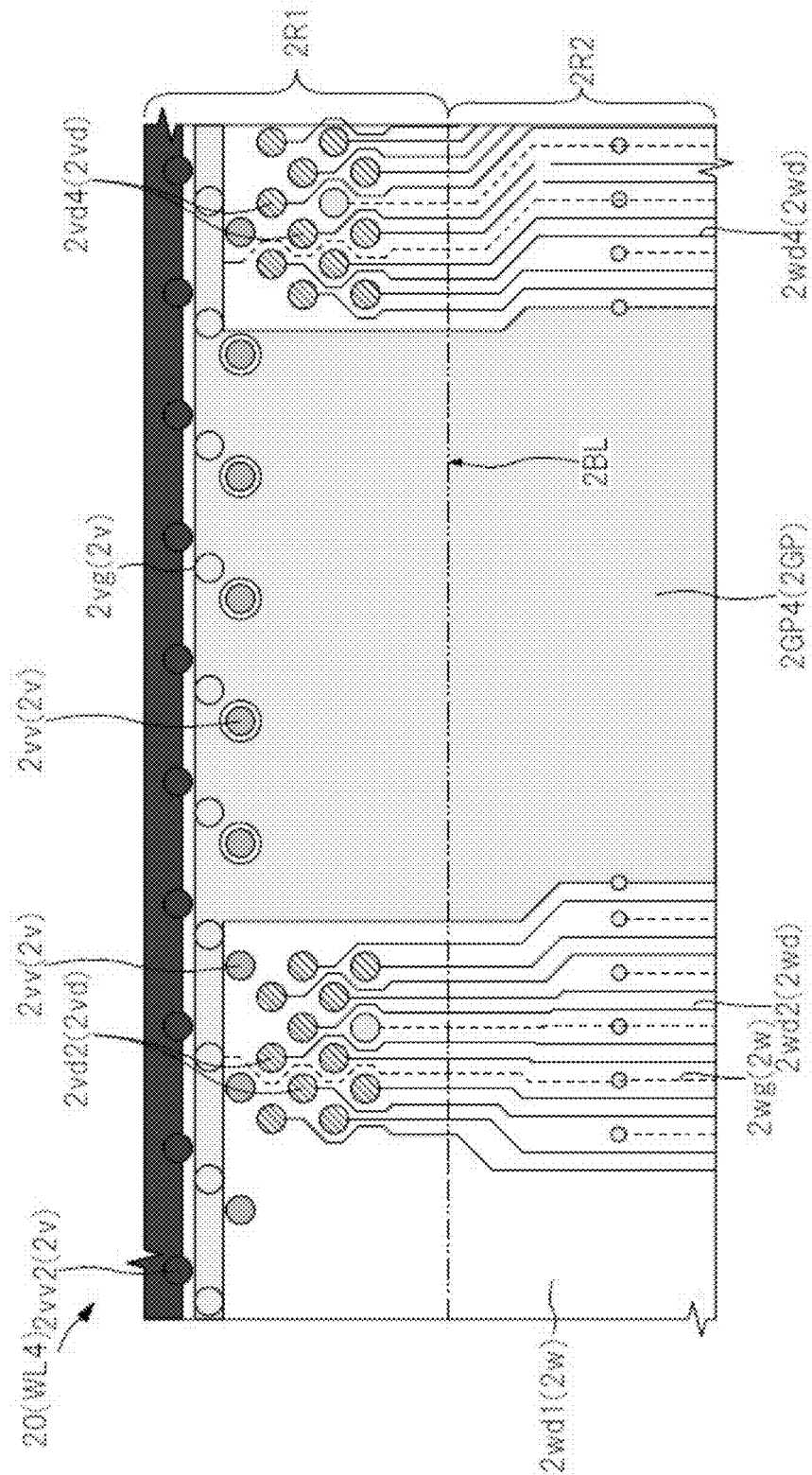
FIG. 13 is an enlarged plan view including a portion corresponding to the portion A of FIG. 6, in the wiring layer shown in FIG. 12.
Figure 14:
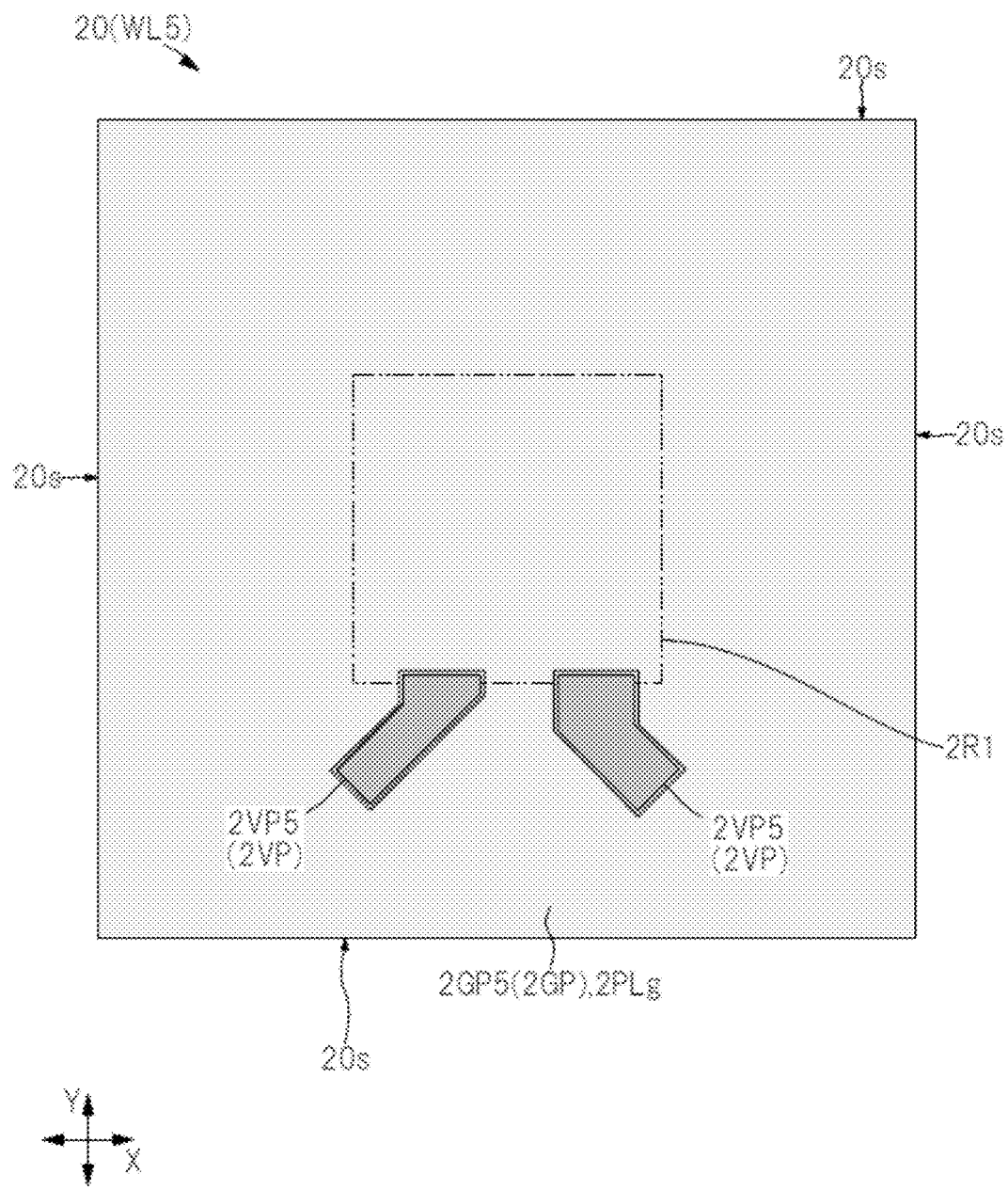
FIG. 14 is a plan view showing an example of layouts of the fifth wiring layer in the wiring substrate shown in FIG. 4.
Figure 15:
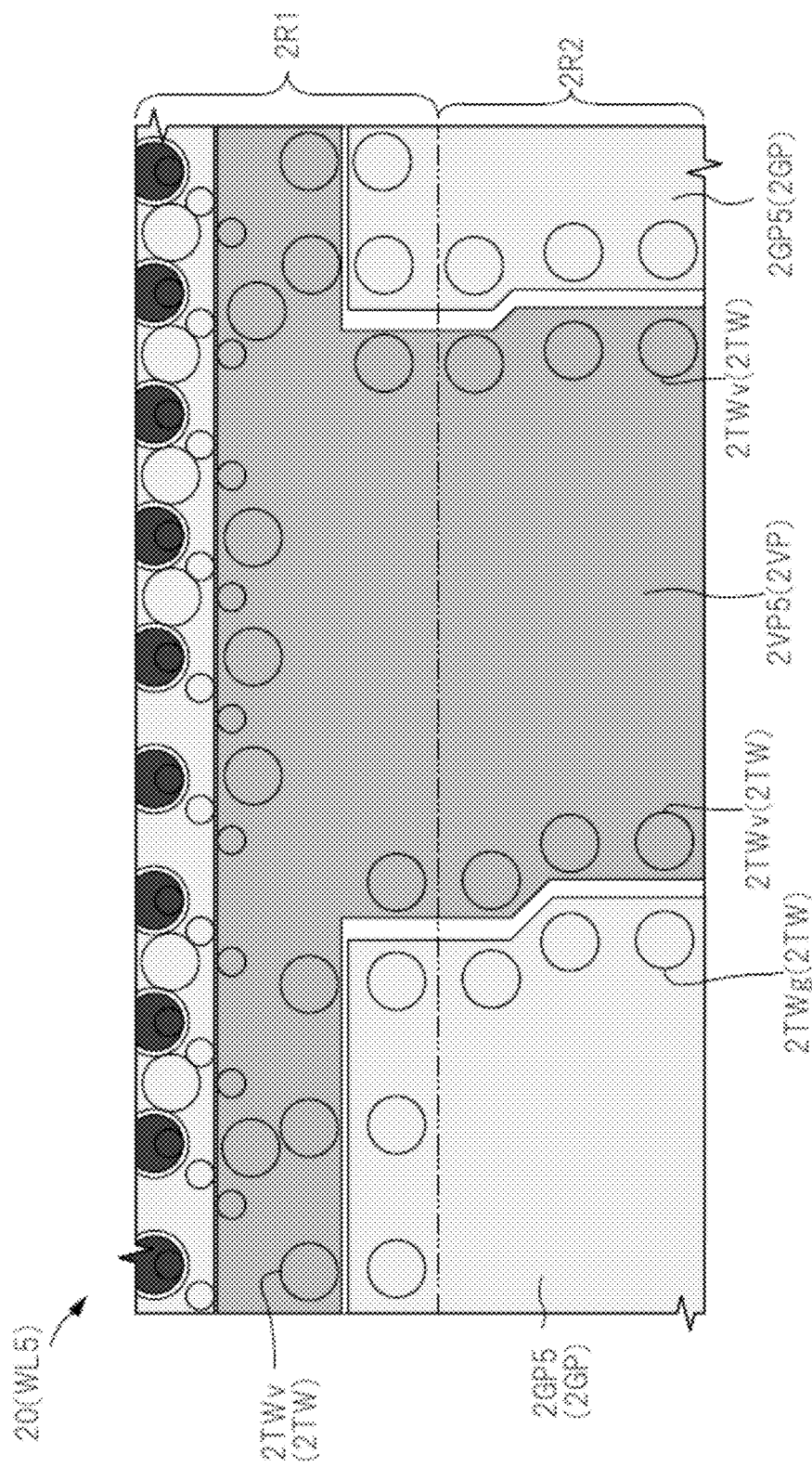
FIG. 15 is an enlarged plan view including a portion corresponding to the portion A of FIG. 6, in the wiring layer shown in FIG. 14.

FIG. 8 is a plan view showing an example of layouts of the second wiring layer in the wiring substrate shown in FIG. 4. FIG. 9 is an enlarged plan view including a portion corresponding to the portion A of FIG. 6, in the wiring layer shown in FIG. 8. FIG. 10 is a plan view showing an example of layouts of the third wiring layer in the wiring substrate shown in FIG. 4. FIG. 11 is an enlarged plan view at a portion A of FIG. 10. FIG. 12 is a plan view showing an example of layouts of the fourth wiring layer in the wiring substrate shown in FIG. 4. FIG. 13 is an enlarged plan view including a portion corresponding to the portion A of FIG. 6, in the wiring layer shown in FIG. 12. FIG. 14 is a plan view showing an example of layouts of the fifth wiring layer in the wiring substrate shown in FIG. 4. FIG. 15 is an enlarged plan view including a portion corresponding to the portion A of FIG. 6, in the wiring layer shown in FIG. 14. FIGS. 9 and 13 show an enlarged plan view of portions overlapping with each other. In FIGS. 9 and 13, in order to distinguish between the signal wiring and the ground wiring $2wg$, the data wiring $2wd$ and the control wiring $2wc$ (only in FIG. 9) are indicated by solid lines, and the ground wiring $2wg$ is indicated by dotted lines.

As shown in FIGS. 8 and 12, the wiring substrate 20 has a plurality of data wirings $2wd$ arranged so as to straddle the border between the region 2R1 and the region 2R2, i.e., the boundary line 2BL shown in FIGS. 9 and 13. Each of the plurality of data wires $2wd$ is electrically connected with the plurality of data terminals 2PDd shown in FIG. 7, and any one of the first through eighth byte data signals SGD1-SGD8 shown in FIG. 5 is transmitted. Each of the plurality of data lines $2wd$ is extended toward the same one of the four sides $20s$ of the wiring substrate 20. In an example shown in FIG. 8, the wiring $2w$ extending toward the side $20s$ other than the side $20s$ to where the plurality of data wires $2wd$ is extended composes a signal transmission path for transmitting a signal to and from another device other than the memory devices MD1 and MD2 shown in FIG. 5. For this reason, in the region 2R2 of the wiring substrate 20, the area that can be secured as the arrangement space of the plurality of data wirings $2wd$ is limited.

Therefore, in the present embodiment, by arranging the data wiring $2wd$ in each of the wiring layer WL2 shown in FIG. 8 and the wiring layer WL4 shown in FIG. 12, the arrangement spaces of the data wirings $2wd$ are secured. As shown in FIGS. 8 and 12, each of the plurality of data wires $2wd$ is arranged so as to straddle the border between the region 2R1 and the region 2R2. In other words, the plurality of data wirings $2wd$ arranged in the wiring layer WL4 shown in FIG. 12 are connected to the wiring layer WL4 via the data via wirings 2*vd* arranged in the region 2R1 in the wiring layer WL2, WL3, and are pulled out from the region 2R1 to the region 2R2 in the wiring layer WL4. As shown in FIG. 9, the data lines 2*wd* connected to the data terminals 2PDd2 and 2PD4 (see FIG. 7) are not arranged in the wiring layers WL2. As a result, the region 2R2 of the wiring layers WL2 can be utilized as arrangement spaces of the data wiring 2*wd*1 connected to the data terminal 2PDd1 (see FIG. 7), the data wiring 2*wd*3 connected to the data terminal 2PDd3 (see FIG. 7), and the control wiring 2*wc* connected to the control terminal 2PDc (see FIG. 7).

Incidentally, considering only the efficient wiring layouts of the plurality of data wirings 2*wd* and the plurality of control wirings 2*wc*, it is conceivable to alternately draw out the data wirings 2*wd* or the control wirings 2*wc* adjacent to each other from the region 2R1 to the region 2R4 in the wiring layers WL2 and WL4.

However, as shown in FIG. 1, in the data signal transmission path DCP for transmitting the data signal SGD between the semiconductor chip 10 and each memory device MD1 and MD2, it is preferable to equalize the characteristics of the plurality of signal transmission paths belonging to the same byte. The characteristics include a characteristic impedance of a signal transmission path, a maximum value of crosstalk, and the like. Therefore, in the wiring substrate 20, from the viewpoint of equalizing the characteristics of a plurality of signal transmission paths belonging to the same byte, a plurality of wirings 2*wd* for transmitting signals of the same byte are drawn out by the same wiring layers.

That is, the plurality of data wirings 2*wd*1 is arranged in the wiring layer WL2 shown in FIG. 9, and the plurality of data wirings 2*wd*2 are arranged in the wiring layer WL4 shown in FIG. 13. Therefore, the plurality of data wirings 2*wd*1 to which the first byte data signal SGD1 (reference FIG. 5) is transmitted and the plurality of data wirings 2*wd*2 to which the second byte data signal SGD2 (see FIG. 5) is transmitted is led out from the region 2R1 to the region 2R2 in the same wiring layers WL2 or WL4, respectively. Therefore, the characteristics of the signal transmission path can be made equal in byte units. In addition, since the data wirings 2*wd*1 and 2*wd*2 connected to the data terminal groups 2PG1 and 2PG2 arranged next to each other (see FIG. 7) are arranged in different wiring layers WL2 or WL4, the signal transmission path of the first byte data signal SGD1 shown in FIG. 5 and the signal transmission path of the second byte data signal SGD2 can reduce the parallel running distance. As a result, it is possible to reduce the crosstalk noise caused by the parallel running of the data wirings 2*wd*.

As can be seen by comparing FIG. 9 and FIG. 13, in plan view, the plurality of data wires 2*wd*1 (see FIG. 9) and the plurality of data wirings 2*wd*2 (see FIG. 13) overlap each other. By arranging the wirings arranged in the different wiring layers WL2 or in the different wiring layers WL4 so as to overlap with each other, the arrangement spaces of the wirings can be increased. For example, as shown in FIG. 9, a large number of via wirings 2*v* are arranged in the region 2R1 of the wiring layers WL2. A plurality of via wiring 2*v* includes a data via wiring 2*wd* electrically connected with the data wiring 2*d*, a control via wiring 2*vc* electrically connected with the control wiring 2*wc*, a power via wiring 2*vv* to which a power supply potential VD (refer to FIG. 5) is supplied, a ground via wiring 2*vg* to which a ground potential VG (see FIG. 5) is supplied, and a core power supply via wiring 2*v*2 electrically connected with the core power supply terminal 2PDv2 (see FIG. 7). The data via wiring 2*vd* includes a data via wiring 2*vd*1 connected to the data wiring 2*wd*1, a data via wiring 2*wd*2 connected to the data wiring 2*wd*2 (refer to FIG. 13), a data via wiring 2*vd*3 connected to the data wiring 2*wd*3, and a data via wiring 2*vd*4 connected to the data wiring 2*wd*4 (see FIG. 13). On the other hand, as shown in FIG. 13, the plurality of vias 2*v* arranged in the region 2R1 of the wiring layers WL4 do not include the plurality of data via wirings 2*vd*1 and 2*vd*3 and the plurality of control via wirings 2*vc* shown in FIG. 9. Therefore, as can be seen by comparing FIG. 9 and FIG. 13, the wiring layer WL4 has a larger area of the areas 2R1 and 2R2 than the wiring layer WL2.

As shown in FIGS. 10 and 11, most of the wiring layer WL3 is covered with the ground pattern 2PLg to which the ground potential VG (see FIG. 5) is supplied. The ground patterns 2PLg are arranged at least in the region 2R2. The ground patterns 2PLg shown in FIG. 11 are interposed between the plurality of data wires 2*wd*1 shown in FIG. 9 and the plurality of data wirings 2*wd*2 shown in FIG. 13. Thus, even when the data wires 2*wd*1 and 2*wd*2 overlap with each other, it is possible to suppress the occurrence of crosstalk noise between the data wirings 2*wd*1 and 2*wd*2.

As shown in FIGS. 9 and 13, the ground line 2*wg* is arranged between the adjacent data lines 2*wd* in the region 2R2. As a result, it is possible to reduce crosstalk noise between adjacent data wirings 2*wd*. In the example shown in FIGS. 9 and 13, two data wirings 2*wd* are adjacent to each other due to space constraints, and one ground wiring 2*wg* is arranged on both sides of the two data wirings 2*wd*. However, from the viewpoint of reducing crosstalk noise, it is more preferable that one data line 2*wd* and one ground line 2*wg* are alternately arranged.

Similarly, the plurality of data wirings 2*wd*3 are arranged in the wiring layer WL2 shown in FIG. 9, and the plurality of data wirings 2*wd*4 are arranged in the wiring layer WL4 shown in FIG. 13. Therefore, since the plurality of data wirings 2*wd*3 to which the third byte data signal SGD3 (see FIG. 5) is transmitted and the plurality of data wirings 2*wd*4 to which the fourth byte data signal SGD4 (see FIG. 5) is transmitted are drawn from the region 2R1 to the region 2R2 in the same wiring layers, respectively, the characteristics of the signal transmission path can be equalized at the byte terminals.

As can be seen by comparing FIG. 9 and FIG. 13, the plurality of data wires 2*wd*3 and the plurality of data wirings 2*wd*4 overlap each other in plan view. As shown in FIGS. 10 and 11, the ground patterns 2PLg are arranged in regions 2R1 and 2R2. The ground patterns 2PLg shown in FIG. 11 are interposed between the plurality of data wires 2*wd*3 shown in FIG. 9 and the plurality of data wirings 2*wd*4 shown in FIG. 13. Thus, even when the data wirings 2*wd*3 and 2*wd*4 overlap with each other, it is possible to suppress the occurrence of crosstalk noise between the data wirings 2*wd*3 and 2*wd*4.

The signal transmission paths connected to the data communication circuits DCC2 shown in FIG. 5 are also the same as those described above. As shown in FIG. 8, each of the plurality of data wirings 2*wd*5 to which the fifth byte data signal SGD5 (refer to FIG. 5) is transmitted and the plurality of data wirings 2*wd*7 to which the seventh byte data signal SGD7 (see FIG. 5) is transmitted is led out from the region 2R1 to the region 2R2 in the wiring layers WL2. As shown in FIG. 12, each of the plurality of data wirings 2*wd*6 to which the sixth byte data signal SGD6 (see FIG. 5) is transmitted and the plurality of data wirings 2*wd*8 to which the eighth byte data signal SGD8 (see FIG. 5) is transmitted is led out from the region 2R1 to the region 2R2 in the wiring layers WL4. As a result, in the signal transmission path connected to the data communication circuit DCC2 shown in FIG. 5, the characteristics of the signal transmission path can be made uniform byte by byte, and the arrangement spaces of the wires can be secured.

As shown in FIGS. 8 and 9, each of the plurality of control wirings 2wc is arranged between the plurality of data wirings 2wd1 and the plurality of data wirings 2wd3 in the wiring layers WL2. As shown in FIG. 8, each of the other plurality of control wirings 2wc is arranged between the plurality of data wirings 2wd5 and the plurality of data wirings 2wd7 in the wiring layers WL2. As a modified example of the present embodiment, a part or all of the plurality of control wirings 2wc may be arranged in the wiring layers WL4 shown in FIG. 12. However, in order to improve the flexibility of wiring layouts in the wiring substrate 20, it is preferable that a large number of signal wirings (data wiring 2wd and control wiring 2wc) arranged in narrow pitch are led out from the region 2R1 to the region 2R2 in the wiring layer located in an upper layer as much as possible (in other words, the wiring layer situated closer to the semiconductor chip 10 shown in FIG. 4). When all of the plurality of control wirings 2wc are drawn out from the region 2R1 to the region 2R2 in the wiring layer WL2 shown in FIG. 8 as in the present embodiment, the control wirings 2wc (see FIG. 8) need not be arranged in the wiring layer WL4 shown in FIG. 12. Therefore, as shown in FIG. 12, a margin space is generated between the data wires 2wd2 and 2wd4 and between the data wirings 2wd6 and 2wd8, respectively, and the ground patterns 2GP4 can be arranged in the margin space.

In FIG. 12, a plurality of ground patterns 2GP4 are separated from each other. However, as a modified example, a large-area ground pattern 2PLg (for example, see FIG. 10) may be formed in an area where another wiring 2w or a via wiring 2v (see FIG. 13) is not formed in the wiring layer WL4. In this instance, the plurality of ground patterns 2GP4 shown in FIG. 12 are formed integrally with the ground pattern 2PLg.

Next, the ground pattern 2GP4 shown in FIG. 12 and the power supply pattern 2VP shown in FIG. 14 will be described. The wiring substrate 20 has a plurality of power supply patterns 2VP (refer to FIG. 14) electrically connected to a plurality of power supply terminals 2PDv (see FIG. 7) and a plurality of ground patterns 2GP electrically connected to a plurality of ground terminals 2PDg (see FIG. 7). The plurality of power supply patterns 2VP is arranged in the wiring layer WL5 and includes a power supply pattern 2VP5 extending so as to straddle the regions 2R1 and 2R2. The power supply pattern 2VP5 overlaps with each of the plurality of power supply terminals 2PDv shown in FIG. 7, in the region 2R1. The plurality of ground patterns 2GP shown in FIG. 12 is arranged in the wiring layer WL4 and include a ground pattern 2GP4 extending so as to straddle the regions 2R1 and 2R2. In the region 2R1 and the region 2R2, the ground pattern 2GP4 is overlapped with the power supply pattern 2VP5 shown in FIG. 14, and is extended in the extending direction of the power supply pattern 2VP.

As shown in FIG. 7, each of the plurality of data terminals 2PDd is arranged along one side of the outer edge of the region 2R1. Therefore, the power supply terminal 2PDv for supplying the power supply potential VD to the data communication circuits DCC1 and DCC2 shown in FIG. 5 is also arranged along the same side as the data terminal 2PDd. Here, in order to stably supply the power supply potential VD in the supply path of the power supply potential VD, it is preferable that large-area power supply patterns 2VP are formed at positions close to the data communication circuits DCC1 and DCC2. By increasing the area of the power supply pattern 2VP5 and increasing the number of paths for supplying the power supply potential VD to the power supply pattern 2VP5, the impedances of the power supply paths, mainly inductances, can be reduced.

In order to reduce the impedance of the power supply path, it is preferable that the ground pattern 2GP4 to which the ground potential VG is supplied is disposed at a position facing the power supply pattern 2VP5.

In the present embodiment, as described with reference to FIG. 12, a margin space is generated between the data wires 2wd2 and 2wd4 and between the data wirings 2wd5 and 2wd8, respectively, and the ground patterns 2GP4 can be arranged in the margin space. Then, as shown in FIG. 14, by arranging the power supply pattern 2VP extending along the ground pattern 2GP4 at a position overlapping with the ground pattern 2GP4 (see FIG. 12), the power supply pattern 2VP5 is increased in area, and by arranging the ground pattern 2GP4 and the power supply pattern 2VP5 at positions facing each other, the impedances of the power supply pattern 2VP5 can be greatly reduced.

However, in the present embodiment, the plurality of data wirings 2wd2 and the plurality of data wirings 2wd4 formed in the wiring layers WL4 shown in FIG. 12 do not overlap with the power supply patterns 2VP shown in FIG. 14. Similarly, the plurality of data wirings 2wd6 and the plurality of data wirings 2wd8 formed in the wiring layers WL4 shown in FIG. 12 do not overlap with the power supply patterns 2VP5 shown in FIG. 14.

The plurality of ground patterns 2GP is arranged in the wiring layer WL5 shown in FIG. 15, and includes a ground pattern 2GP5 arranged so as to adjacent to the power supply pattern 2VP5 in the region 2R2. As shown in FIG. 14, in the present embodiment, the ground pattern 2GP5 also serves as the ground pattern 2PLg formed so as to cover most of the region 2R2. In the area 2R2, each of the plurality of data wirings 2wd2 and the plurality of data wirings 2wd4 arranged in the wiring layer WL4 shown in FIG. 12 overlaps with the ground patterns 2GP5 formed in the wiring layer WL5, see FIGS. 14 and 15. In this instance, since the electromagnetic wave spreading around the power supply pattern 2VP5 of FIG. 15 or the electromagnetic wave spreading around each of the data wiring 2wd2 and the data wiring 2wd4 shown in FIG. 12 can be shielded by the ground pattern 2GP5 shown in FIG. 14, the crosstalk noise between the data wires 2wd4 can be reduced.

As described above, in the present embodiment, the plurality of control wirings 2wc (refer to FIG. 9) are arranged in the wiring layer WL2 shown in FIG. 9, thereby providing spaces for arranging the ground patterns 2GP4 in the wiring layer WL4 (see FIG. 12). Therefore, in the region 2R1 and the region 2R2, the power supply patterns 2VP5 (refer to FIG. 14) formed in the wiring layer WL5 (see FIG. 14) is overlapped with each of the plurality of control wirings 2wc formed in the wiring layer WL2, and is extended in the extending direction of the plurality of control wirings 2wc.

Further, when a large number of control wirings 2wc are arranged in the wiring layer WL2, the arrangement spacing of the wirings 2w arranged in the area 2R2 of the wiring layer WL2 needs to be narrowed. Therefore, part of the plurality of control wires 2wc overlaps part of the plurality of data wirings 2wd2 or the plurality of data wirings 2wd4 shown in FIG. 13 in the region 2R2.

As described above, in the present embodiment, the insulating layer 2CR serving as a core insulating layer is provided between the wiring layer WL5 and the wiring layer WL6 shown in FIG. 4, the wiring layer WL5 is provided on upper surface 2Ct of the insulating layer 2CR, and the wiring layer WL6 is provided on the lower surface. The wiring layer WL5 and the wiring layer WL6 are electrically connected via a plurality of through-hole wirings 2TW penetrating the insulating layer 2CR. As shown in FIG. 15, the plurality of through-hole wires 2TW includes a plurality of power supply through-hole 2TWv wirings electrically connected to the power supply patterns 2VP5.

Considering the impedances of the supply paths of the power supply potential VD (see FIG. 5), it is preferable that the number of the power supply through holes 2TWv be large. By increasing the number of the power supply through holes 2TWv, it is possible to reduce impedances (mainly inductances) of the supply paths of the power supply potentials VD. In this case, the characteristics of the power supply path can be improved. In the present embodiment, the power supply pattern 2VP5 is extended so as to straddle each of the region 2R1 and the region 2R2. Therefore, a plurality of power supply through holes 2TWv connected to the power supply patterns 2VP5 are formed in the regions 2R1 and 2R2, respectively. In other words, according to the present embodiment, in addition to the region 2R1 overlapping with the semiconductor chip 10 (see FIG. 4), the power supply potential 2VD can be supplied from the region 2R2 around the semiconductor chip 10 (see FIG. 4), so that the impedances of the power supply paths can be reduced and the power supply characteristics can be improved.

Figure 16:
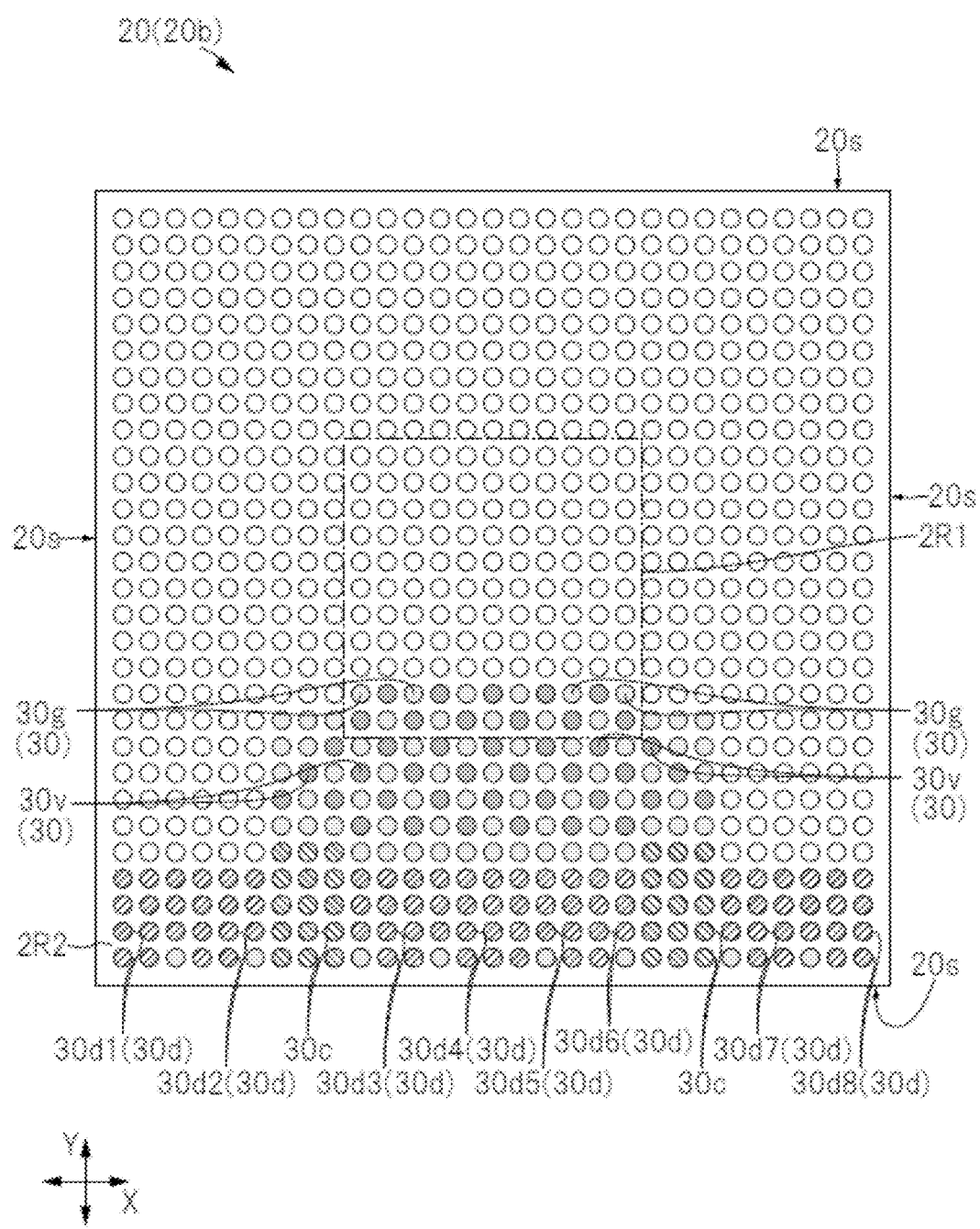
FIG. 16 is a bottom view of the wiring substrate shown in FIG. 2.

In order to reduce impedances of paths for supplying power supply potentials to the plurality of power supply through holes 2TWv, it is preferable that power supply external terminals 30v for power supply are arranged in regions 2R1 and 2R2, respectively, as shown in FIG. 16. FIG. 16 is a bottom view of the wiring substrate shown in FIG. 2.

As shown in FIG. 16, in the wiring substrate 20, a plurality of external terminals 30 are connected to the lower surface 20b of upper surface 20t (refer to FIG. 4) on which the semiconductor chip 10 (see FIG. 4) is mounted. The plurality of external terminals 30 include a plurality of power supply external terminals 30v electrically connected to the power supply patterns 2VP5. The plurality of power supply external terminals 30v are connected to the regions 2R1 and 2R2, respectively. In this manner, the impedances of the power supply paths can be reduced and the power supply characteristics can be improved by providing each of the regions 2R1 and 2R2 in the arrangement of the external terminals 30 on the lower surface 20b of the wiring substrate 20.

Figure 17:
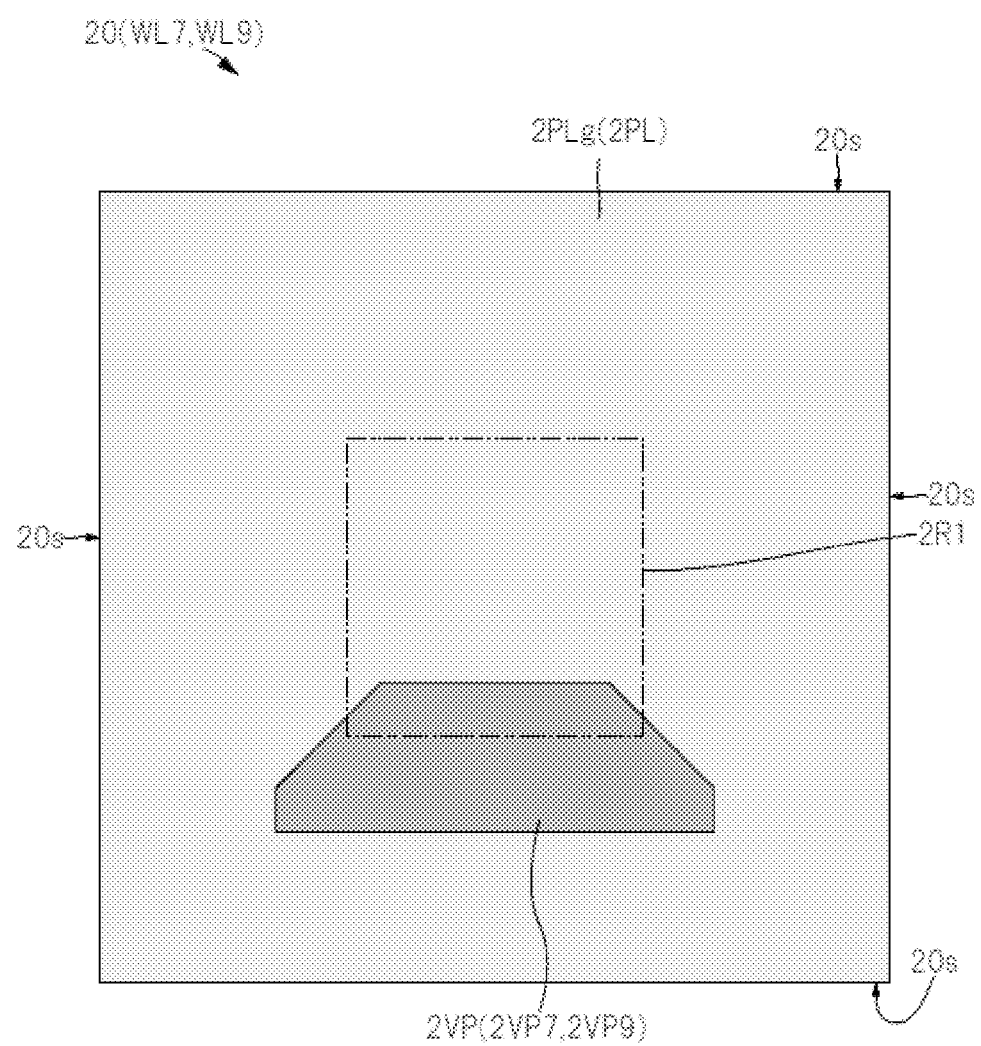
FIG. 17 is a plan view showing a configuration example of the seventh and ninth wiring layers of the wiring substrate shown in FIG. 4.

In order to reduce the impedances of the power supply paths from the power supply external terminals 30v shown in FIG. 16 to the power supply pattern 2VP5 shown in FIG. 14, it is preferable to form the large-area power supply pattern 2VP shown in FIG. 17 in any of the wiring layers WL6, WL7, WL8 and WL9 shown in FIG. 4. FIG. 17 is a plan view showing a configuration example of the seventh and ninth wiring layers of the wiring substrate shown in FIG. 4. For example, in the wiring layer WL7 and the wiring layer WL9, large-area power supply patterns 2VP7 and 2VP9 are formed at positions overlapping with the power supply pattern 2VP5 shown in FIG. 14.

As described with reference to FIG. 1, the semiconductor device PKG1 of the present embodiment is a device for communicating a data signal with the memory devices MD1 and MD2 which are external devices. Therefore, the plurality of external terminals shown in FIG. 16 are provided with external terminals for transmitting data signals. More specifically, the plurality of external terminals 30 include a plurality of data external terminals 30d1 electrically connected to the plurality of data wires 2wd1 (refer to FIG. 8), a plurality of data external terminals 30d2 electrically connected to the plurality of data wirings 2wd2 (see FIG. 12), a plurality of data external terminals 30d3 electrically connected to the plurality of data wirings 2wd3 (see FIG. 8), and a plurality of data external terminals 30d4 electrically connected to the plurality of data wirings 2wd4 (see FIG. 12). The plurality of external terminals include a plurality of data external terminals 30d5 electrically connected to the plurality of data wires 2wd5 (refer to FIG. 8), a plurality of data external terminals 30d6 electrically connected to the plurality of data wirings 2wd6 (see FIG. 12), a plurality of data external terminals 30d7 electrically connected to the plurality of data wirings 2wd7 (see FIG. 8), and a plurality of data external terminals 30d8 electrically connected to the plurality of data wirings 2wd8 (see FIG. 12).

Several modified examples have been described in the above embodiments, but in the following, typical modified example other than modified example described in the above embodiments will be described.

First Modified Example

Figure 18:
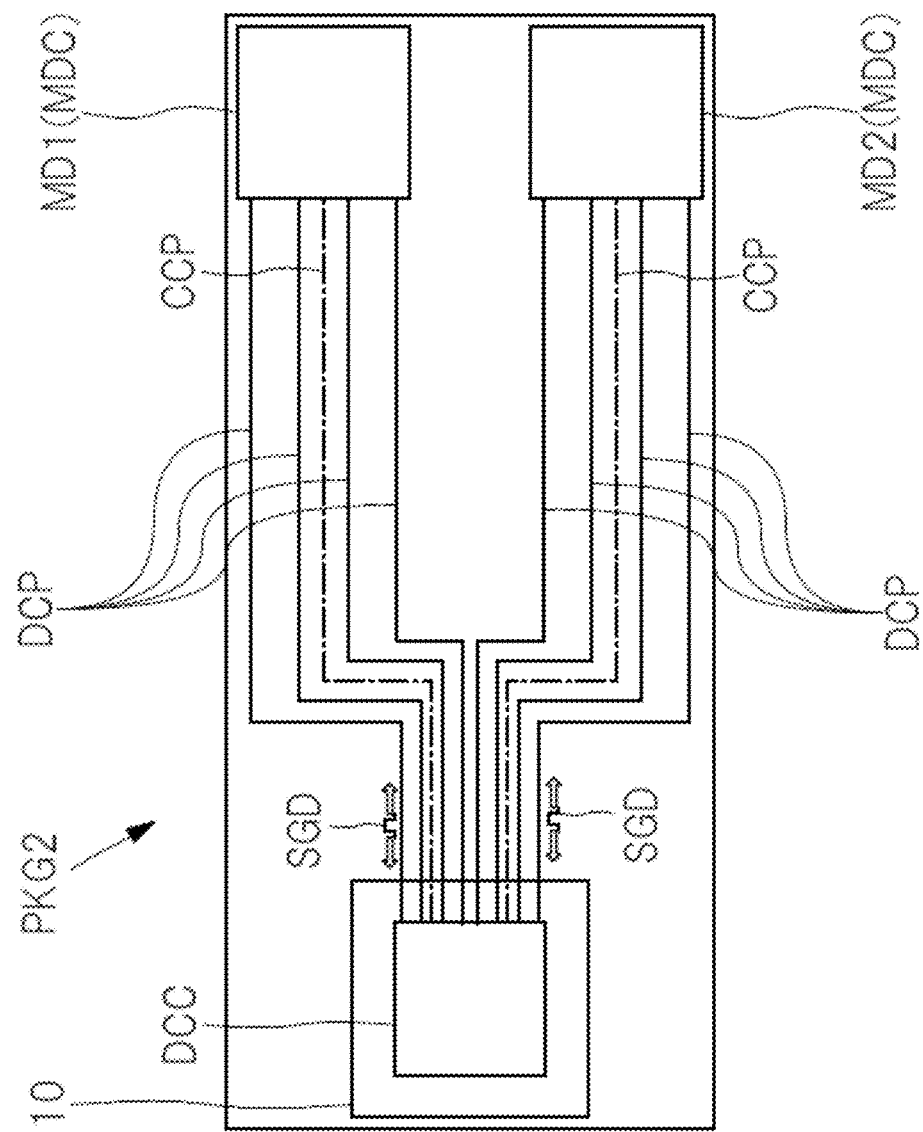
FIG. 18 is an explanatory diagram schematically showing a modified example of a data communication system shown in FIG. 1.
Figure 19:
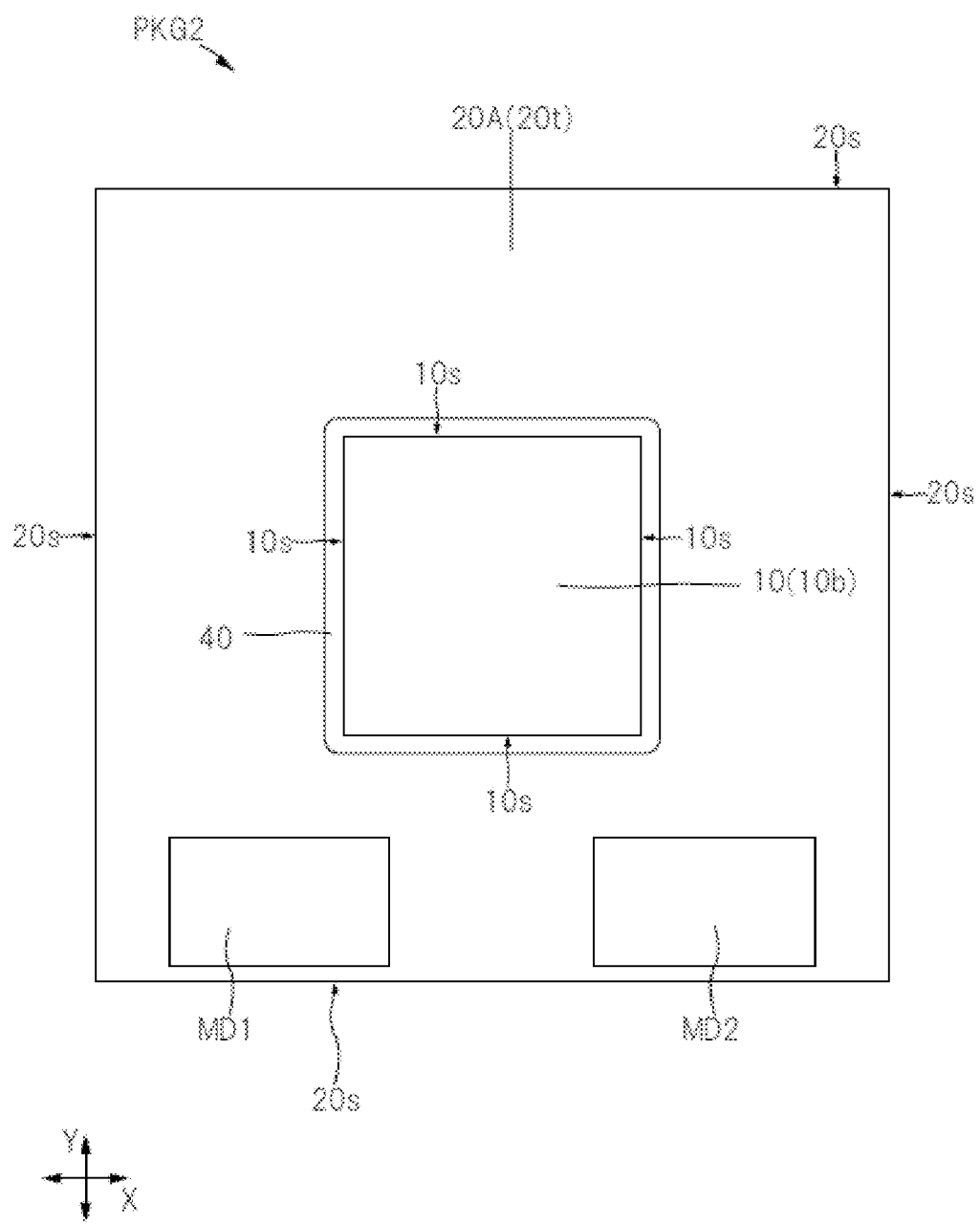
FIG. 19 is a plan view seen from a mounting surface side of the semiconductor device shown in FIG. 18, on which a semiconductor chip is mounted.
Figure 20:
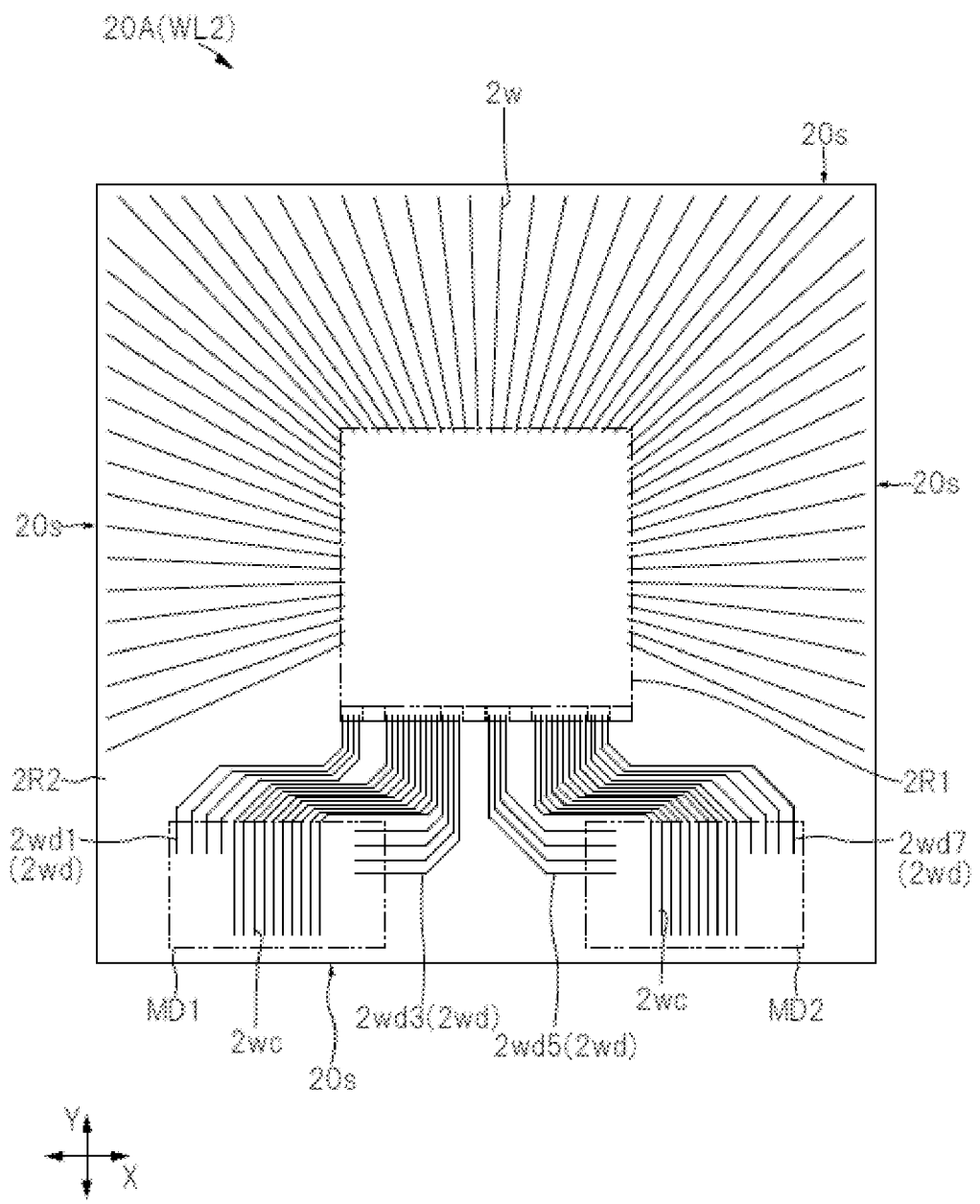
FIG. 20 is a plan view showing an example of layouts of the second wiring layer in the wiring substrate shown in FIG. 19.

FIG. 18 is an explanatory diagram schematically showing a modified example of a data communication system shown in FIG. 1. FIG. 19 is a plan view seen from a mounting surface side of the semiconductor device shown in FIG. 18, on which a semiconductor chip is mounted. FIG. 20 is a plan view showing an example of layouts of the second wiring layer in the wiring substrate shown in FIG. 19. In FIG. 20, regions overlapping with the memory devices MD1 and MD2 shown in FIG. 19 are indicated by two-dot chain lines.

A semiconductor device PKG2 shown in FIG. 18 differs from semiconductor device PKG1 shown in FIG. 1 in that the memory devices MD1 and MD2 are incorporated in semiconductor device PKG2. Each memory device (memory component) MD1 and MD2 has a memory circuit MDC for a transmitting a data signal SGD to and from the data communication circuit DCC. As shown in FIG. 19, each of the memory devices (memory components) MD1 and MD2 is mounted on upper surface 20t of the wiring substrate 20A.

In the case of the semiconductor device PKG 2, since the memory devices MD1 and MD2 are mounted on upper surface 20t of the wiring substrate 20A, as shown in FIG. 20, the plurality of data wirings 2wd1 and 2wd3 and the control wiring 2wc in the wiring layer WL2 are led out to the region overlapping with the memory device MD1. In other words, in plan view, in the wiring layers WL2, a part of each of the plurality of data wirings 2wd1 and 2wd3 and the control wirings 2wc overlaps with the memory devices MD1. Therefore, each of the plurality of data wirings 2wd1, the plurality of data wirings 2wd3 and the plurality of control wirings 2wc is coupled with the memory circuit MDC (see FIG. 18) without going through each of the wiring layer WL3, the wiring layer WL4 and the wiring layer WL5 shown in FIG. 4.

Similarly, in the wiring layers WL2, each of the plurality of data wirings 2wd5 and 2wd7 and the other control wirings 2wc is led out to an area where the data wirings 2wd5 and 2wd7 and the other control wirings 2wc overlap with the memory devices MD2. In other words, in plan view, in the wiring layers WL2, a part of each of the plurality of data wirings 2wd5 and 2wd7 and the other control wirings 2wc overlaps with the memory devices MD2. Therefore, each of the plurality of data wirings 2wd5, the plurality of data wirings 2wd7 and the plurality of other control wirings 2wc is coupled with the memory circuit MDC (see FIG. 18) without going through each of the wiring layer WL3, the wiring layer WL4 and the wiring layer WL5 shown in FIG. 4.

Except for the differences described above, semiconductor device PKG2 shown in FIGS. 18 and 19 is the same as semiconductor device PKG1 shown in FIG. 1. Therefore, duplicate descriptions are omitted.

Second Modified Example

Figure 21:
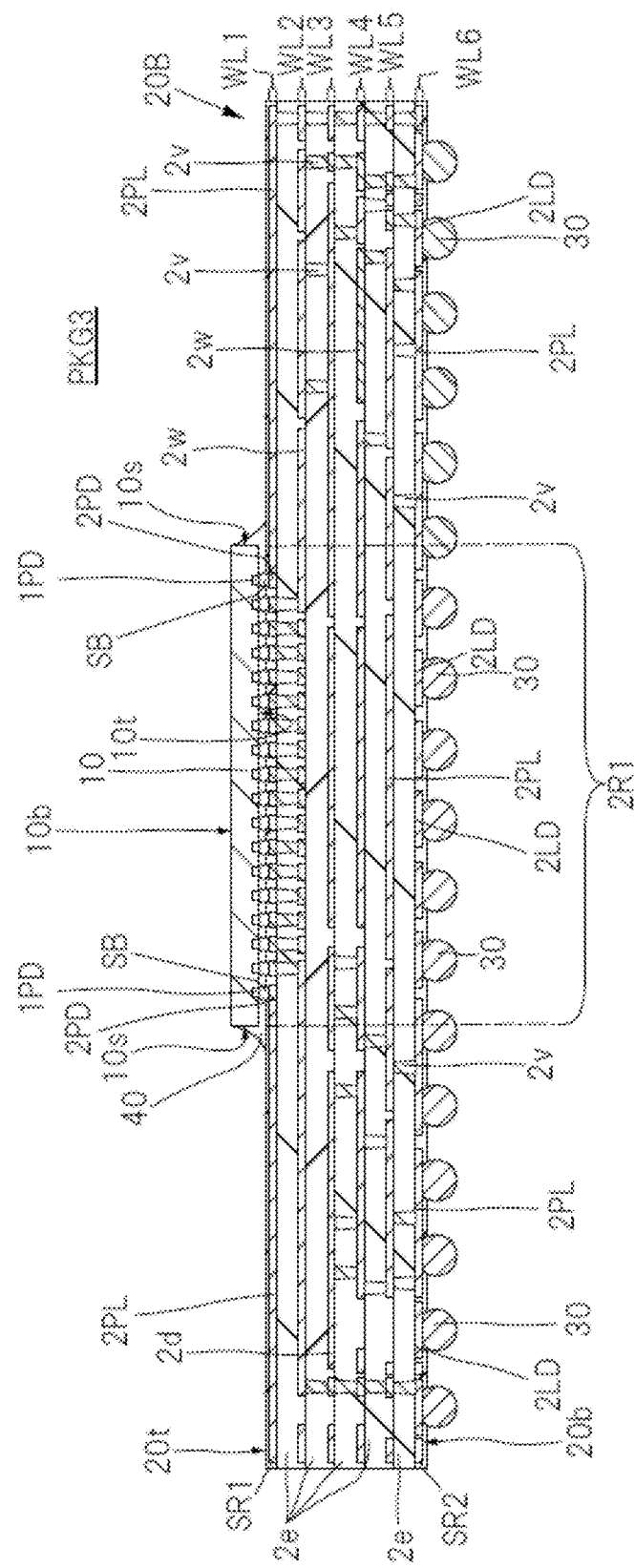
FIG. 21 is a cross-section view showing a modified example with respect to FIG. 4.

FIG. 21 is a cross-section view showing a modified example with respect to FIG. 4. A semiconductor device PKG3 shown in FIG. 21 has a wiring substrate 20B. The wiring substrate 20B differs from the wiring substrate 20 shown in FIG. 4 in that it is a so-called coreless substrate having no core insulating layers. Therefore, the wiring substrate 20B does not have the plurality of through-hole wirings 20TW shown in FIG. 4. The wiring substrate 20B has a six-layer configuration. In this instance, the wiring layer WL6 of the wiring substrate 20B performs the same function as the wiring layer WL10 of the wiring substrate 20 shown in FIG. 4, that is, functions as a land forming layer. Also, in the wiring substrate 20B, the layout of the plurality of external terminals 30 is the same as the layout of the wiring substrate 20 shown in FIG. 16. That is, the plurality of external terminals 30 include a plurality of power supply external terminals 30v (refer to FIG. 16) electrically connected to the power supply patterns 2VP5 (see FIG. 14). The plurality of power supply external terminals 30v are connected to the regions 2R1 and 2R2, respectively. As a result, the impedance of the power supply path can be reduced and the power supply characteristic can be improved.

Except for the differences described above, semiconductor device PKG3 shown in FIG. 21 is the same as semiconductor device PKG1 shown in FIG. 4. Therefore, duplicate descriptions are omitted.

Third Modified Example

In addition, for example, although various types of modified example have been described as described above, it is possible to combine modified example described above.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
   a semiconductor chip having a data communication circuit communicating a data signal; and
   a wiring substrate having:
      a first region overlapping with the semiconductor chip, and
      a second region surrounding the first region in plan view,
   wherein the semiconductor chip has a plurality of data electrodes each coupled with the data communication circuit and each transmitting the data signal,
   wherein the wiring substrate includes:
      a first wiring layer,
      a second wiring layer located in a lower layer than the first wiring layer,
      a third wiring layer located in a lower layer than the second wiring layer,
      a plurality of data terminals arranged at a position in the first region, which is facing the plurality of data electrodes of the semiconductor chip, and electrically connected with the plurality of data electrodes, respectively, and
      a plurality of data wirings arranged so as to straddle a border between the first region and the second region and electrically connected with the plurality of data terminals, respectively,
   wherein the plurality of data terminals includes:
      a plurality of first data terminals each transmitting a first byte data signal, and
      a plurality of second data terminals each transmitting a second byte data signal,
   wherein the plurality of data wirings includes:
      a plurality of first data wirings electrically connected with the plurality of first data terminals, respectively, and
      a plurality of second data wirings electrically connected with the plurality of second data terminals, respectively,
   wherein, in plan view, a first data terminal group, in which the plurality of first data terminals is arranged next to each other, and a second data terminal group, in which the plurality of second data terminals is arranged next to each other, are arranged next to each other,
   wherein, in the first wiring layer, each of the plurality of first data wirings is arranged so as to straddle the border between the first region and the second region,
   wherein, in the third wiring layer, each of the plurality of second data wirings is arranged so as to straddle the border between the first region and the second region,
   wherein, in plan view, the plurality of first data wirings and the plurality of second data wirings are overlapped with each other, and
   wherein, in the second wiring layer, a first ground pattern to which a ground potential is supplied is arranged at a position overlapping with each of the plurality of first data wirings and the plurality of second data wirings.

2. The semiconductor device according to claim 1,
   wherein the plurality of data terminals includes:
      a plurality of third data terminals each transmitting a third byte data signal, and
      a plurality of fourth data terminals each transmitting a fourth byte data signal,
   wherein the plurality of data wirings includes:
      a plurality of third data wirings electrically connected with the plurality of third data terminals, respectively, and
      a plurality of fourth data wirings electrically connected with the plurality of fourth data terminals, respectively,
   wherein, in plan view, a third data terminal group, in which the plurality of third data terminals is arranged next to each other, and a fourth data terminal group, in which the plurality of fourth data terminals is arranged next to each other, are arranged next to each other,
   wherein, in the first wiring layer, each of the plurality of third data wirings is arranged so as to straddle the border between the first region and the second region,
   wherein, in the third wiring layer, each of the plurality of fourth data wirings is arranged so as to straddle the border between the first region and the second region, wherein, in plan view, the plurality of third data wirings and the plurality of fourth data wirings are overlapped with each other, and wherein, in the second wiring layer, the first ground pattern is arranged at a position overlapping with each of the plurality of third data wirings and the plurality of fourth data wirings.

3. The semiconductor device according to claim 2, wherein the semiconductor chip includes:
- a plurality of power supply electrodes each supplying a power supply potential to the data communication circuit, and
- a plurality of ground electrodes each supplying the ground potential to the data communication circuit, wherein the wiring substrate includes:
- a plurality of power supply terminals arranged at a position in the first region, which is facing the plurality of power supply electrodes of the semiconductor chip, and electrically connected with the plurality of power supply electrodes, respectively,
- a plurality of ground terminals arranged at a position in the first region, which is facing the plurality of ground electrodes of the semiconductor chip, and electrically connected with the plurality of ground electrodes, respectively,
- a plurality of power supply patterns electrically connected with the plurality of power supply terminals, respectively,
- a plurality of ground patterns electrically connected with the plurality of ground terminals, respectively, and
- a fourth wiring layer located in a lower layer than the third wiring layer, wherein, in the first region, each of the plurality of data terminals is arranged at an outer position than the plurality of power supply terminals, wherein the plurality of power supply patterns has:
a first power supply pattern arranged so as to straddle the border between the first region and the second region, in the fourth wiring layer, wherein, in the first region, the first power supply pattern is overlapped with the plurality of power supply terminals, wherein the plurality of ground patterns has:
a second ground pattern arranged so as to straddle the border between the first region and the second region, in the third wiring layer, and wherein, in each of the first region and the second region, the second ground pattern is overlapped with the first power supply pattern, and is extended in an extending direction of the first power supply pattern.

4. The semiconductor device according to claim 3, wherein, in the second region, each of the plurality of second data wirings arranged in the third wiring layer and the plurality of third data wirings arranged in the third wiring layer is not overlapped with the first power supply pattern arranged in the fourth wiring layer.

5. The semiconductor device according to claim 4, wherein the plurality of ground patterns includes:
- a third ground pattern arranged in the fourth wiring layer and arranged so as to be adjacent to the first power supply pattern in the second region, and wherein, in the second region, each of the plurality of second data wirings arranged in the third wiring layer and the plurality of third data wirings arranged in the third wiring layer is overlapped with the third ground pattern arranged in the fourth wiring layer.

6. The semiconductor device according to claim 3, wherein the semiconductor chip includes a plurality of control electrodes coupled with the data communication circuit and each transmitting the control signal, wherein the wiring substrate has:
- a plurality of control terminals arranged at a position in the first region, which is facing the plurality of control electrodes of the semiconductor chip, and electrically connected with the plurality of control electrodes, respectively, and
- a plurality of control wirings arranged so as to straddle the border between the first region and the second region and electrically connected with the plurality of control terminals, respectively, wherein, in the first region, each of the plurality of control terminals is arranged at an outer position than the plurality of power supply terminals, wherein, in plan view, a control terminal group, in which the plurality of control terminals is arranged next to each other, is arranged next to each of the second data terminal group and the third data terminal group, and wherein the first data terminal group, the second data terminal group, the third data terminal group, the fourth data terminal group and the control terminal group are arranged along a side of the first region.

7. The semiconductor device according to claim 6, wherein, in the first wiring layer, each of the plurality of control wirings is arranged between the plurality of first data wirings and the fourth data wirings.

8. The semiconductor device according to claim 7, wherein, in each of the first region and the second region, the first power supply pattern arranged in the fourth wiring layer is overlapped with each of the plurality of control wirings arranged in the first wiring layer, and is extended in an extending direction of each of the plurality of control wirings.

9. The semiconductor device according to claim 6, wherein, in the second region, a part of the plurality of control wirings is overlapped with one of a part of the plurality of second data wiring and a part of the plurality of third data wiring.

10. The semiconductor device according to claim 3, wherein the wiring substrate includes:
- a core insulating layer having a surface on which the fourth wiring layer is formed, and
- a plurality of through-hole wirings each penetrating through the core insulating layer, wherein the plurality of through-hole wirings includes a plurality of power supply through-hole wirings each electrically connected with the first power supply pattern, and wherein the plurality of power supply through-hole wirings includes:
- a first power supply through-hole wiring formed in the first region, and
- a second power supply through-hole wiring formed in the second region.

11. The semiconductor device according to claim 10, wherein a plurality of external terminals is connected on a surface of the wiring substrate, which is opposite to a surface on which the semiconductor chip is mounted, wherein the plurality of external terminals includes a plurality of power supply external terminals each electrically connected with the first power supply pattern, and wherein the plurality of power supply external terminals includes:

a first power supply external terminal connected in the first region, and a second power supply external terminal connected in the second region.

12. The semiconductor device according to claim 6, further comprising:

a memory component having a memory circuit, the data signal being transmitted between the memory circuit and the data communication circuit, wherein the semiconductor chip and the memory component are mounted on a first surface of the wiring substrate, and wherein each of the plurality of first data wirings, the plurality of third data wirings and the plurality of control wirings is coupled with the memory circuit without going through each of the second wiring layer, the third wiring layer and the fourth wiring layer.

13. The semiconductor device according to claim 3, wherein a plurality of external terminals is connected on a surface of the wiring substrate, which is opposite to a surface on which the semiconductor chip is mounted, and wherein the plurality of external terminals includes:

a plurality of first external terminals electrically connected with the plurality of first data wirings, respectively, a plurality of second external terminals electrically connected with the plurality of second data wirings, respectively, a plurality of third external terminals electrically connected with the plurality of third data wirings, respectively, and a plurality of fourth external terminals electrically connected with the plurality of fourth data wirings, respectively.

14. The semiconductor device according to claim 3, wherein the wiring substrate includes a terminal forming layer located in an upper layer than the first wiring layer, and in which the plurality of data terminals, the plurality of power supply terminals and the plurality of ground terminals are formed, and wherein the plurality of ground patterns includes:

a fourth ground pattern formed in the second region of wiring substrate and overlapped with each of the plurality of data wirings.

* * * * *